(12) United States Patent
Ogawa et al.

(10) Patent No.: US 8,031,474 B2
(45) Date of Patent: Oct. 4, 2011

(54) PRINTED CIRCUIT BOARD ASSEMBLY AND METHOD OF MANUFACTURING THE SAME

(75) Inventors: Minoru Ogawa, Gifu (JP); Kazuto Nishimoto, Gifu (JP)

(73) Assignee: Sony Corporation, Tokyo (JP)

( * ) Notice: Subject to any disclaimer, the term of this patent is extended or adjusted under 35 U.S.C. 154(b) by 855 days.

(21) Appl. No.: 11/627,844

(22) Filed: Jan. 26, 2007

(65) Prior Publication Data
US 2007/0176613 A1    Aug. 2, 2007

(30) Foreign Application Priority Data
Jan. 31, 2006   (JP) .................................. 2006-023153

(51) Int. Cl.
*H05K 1/18* (2006.01)
(52) U.S. Cl. ......... 361/761; 361/758; 361/785; 361/760
(58) Field of Classification Search .................. 361/758, 361/785, 761, 760, 744
See application file for complete search history.

(56) References Cited

U.S. PATENT DOCUMENTS

| | | | | |
|---|---|---|---|---|
| 3,533,023 A | * | 10/1970 | Friend et al. ................... | 333/246 |
| 5,371,654 A | * | 12/1994 | Beaman et al. ................ | 361/744 |
| 6,080,336 A | * | 6/2000 | Suehiro et al. ................. | 252/514 |
| 6,374,733 B1 | * | 4/2002 | Hayama et al. ................ | 101/170 |
| 6,449,168 B1 | * | 9/2002 | Soderholm .................... | 361/761 |
| 6,562,454 B2 | * | 5/2003 | Takahashi et al. ............. | 428/354 |
| 6,613,413 B1 | * | 9/2003 | Japp et al. ...................... | 428/131 |
| 6,812,412 B2 | * | 11/2004 | Obata et al. .................... | 174/261 |
| 6,941,648 B2 | * | 9/2005 | Shimizu et al. ................. | 29/830 |
| 6,981,320 B2 | * | 1/2006 | Ho et al. ......................... | 29/852 |
| 2002/0020554 A1 | * | 2/2002 | Sakamoto et al. ............. | 174/261 |
| 2003/0060172 A1 | * | 3/2003 | Kuriyama et al. ............. | 455/90 |

FOREIGN PATENT DOCUMENTS

| | | |
|---|---|---|
| JP | 08-008539 | 1/1996 |
| JP | 08-008539 | 12/1996 |
| JP | 11-168279 | 6/1999 |

* cited by examiner

*Primary Examiner* — Tuan T Dinh
*Assistant Examiner* — Steven Sawyer
(74) *Attorney, Agent, or Firm* — K&L Gates LLP

(57) ABSTRACT

A printed circuit board assembly has plural printed circuit boards that are mechanically and electrically connected to each other with them being stacked, and a connection layer that connects the adjacent two printed circuit boards to each other is provided. The connection layer includes an insulation portion and an electric conduction portion. The insulation portion contains an insulating member and is adhered to each of the adjacent two printed circuit boards. The electric conduction portion passes through the insulation portion and connects electrode terminals of the adjacent two printed circuit boards.

4 Claims, 20 Drawing Sheets

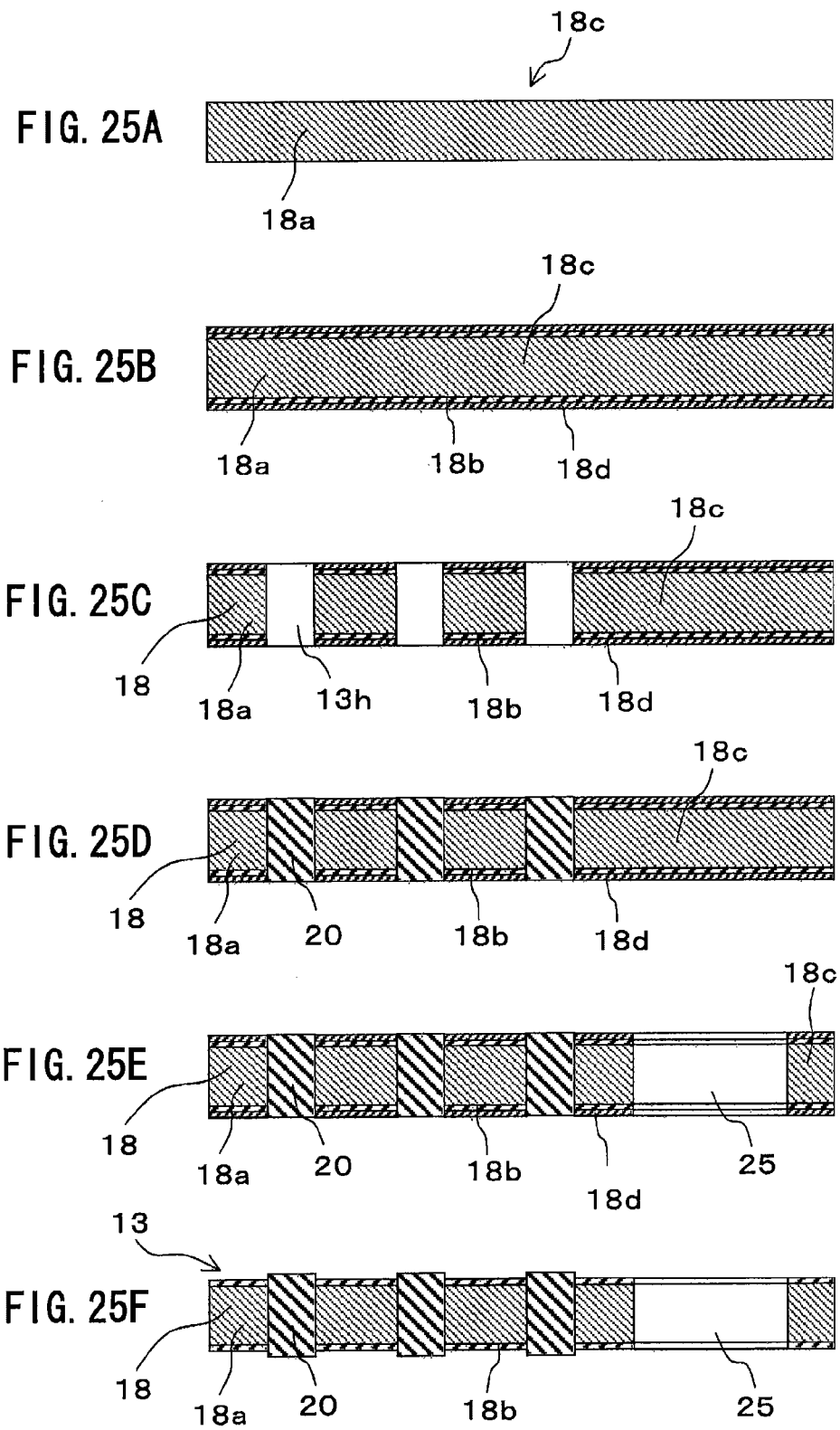

PRINTED CIRCUIT BOARD ASSEMBLY AND METHOD OF MANUFACTURING THE SAME

CROSS REFERENCE TO RELATED APPLICATION

The present application to Japanese Patent Application JP 2006-23153 filed in the Japanese Patent Office on Jan. 31, 2006, the entire contents of which being incorporated herein by reference.

BACKGROUND

The present application relates to a printed circuit board assembly which is available for hardware such as a portable phone, and a method of manufacturing the same.

Accompanying with enhancing functionality of the hardware such as the portable phone and downsizing it, multiple layers for circuit wiring have been advanced in any printed circuit boards that are available for the hardware. Such the multiple layers for circuit wiring in the printed circuit boards have enabled a degree of freedom in the circuit wiring to be increased, thereby allowing a high density of wired wires to be implemented. Multi-layered printed circuit board has been made in general by using build-up technology or the like such that insulation layers and wiring layers have been alternately formed on a core printed circuit board.

Alternatively, Japanese Patent Application Publication No. H11-168279 has disclosed that a multi-layered printed circuit board assembly and a method of manufacturing the same in which an air layer stays between the stacked plastic sheets. The multi-layered printed circuit board disclosed in Japanese Patent Application Publication No. H11-168279 is manufactured so that plastic sheets each having circuit patterns and electrode terminals are stacked and connected to each other electrically via a solvent-soluble filler layer having a predetermined thickness and then, the solvent-soluble filler layer can be dissolved to provide the air layer between the stacked plastic sheets.

Further, Japanese Patent Application Publication No. H08-8539 has disclosed that a multi-layered printed circuit board assembly and a method of manufacturing the same in which metal layers of the printed circuit boards are plated and connected to each other. The multi-layered printed circuit board assembly disclosed in Japanese Patent Application Publication No. H08-8539 is manufactured so that printed circuit boards each in which a circuit pattern of metal layer is formed are faced to each other and held at a predetermined position and the metal layers in the circuit patterns that are faced to each other are connected to each other using electrolytic plating by energizing the metal layers.

However, in the above-mentioned method of manufacturing the multi-layered printed circuit board assembly using the build-up technology, as the numbers of layers of the printed circuit boards to be manufactured are increased, proportion defective may be accumulated in the layers, so that a yield rate for a final complete printed circuit board assembly is decreased, thereby causing manufacture costs for the multi-layered printed circuit board assembly to increase.

According to the multi-layered printed circuit board assembly and the method of manufacturing the same, which have been disclosed in Japanese Patent Application Publication No. H11-168279, it is necessary to dissolve the solvent-soluble filler layer between the plastic sheets after the plastic sheets have been connected to each other via the solvent-soluble filler layer. This causes the manufacture steps to be complicated, thereby increasing its manufacture costs.

Further, according to the multi-layered printed circuit board assembly and the method of manufacturing the same, which have been disclosed in Japanese Patent Application Publication No. H08-8539, it is necessary to connect the printed circuit boards to each other using electrolytic plating by energizing the metal layers with the metal layers being face to each other in the printed circuit board assembly when connecting the printed circuit boards. This also causes the manufacture steps to be complicated, thereby increasing its manufacture costs.

SUMMARY

It is thus desirable to provide a printed circuit board assembly in which a configuration of multiple layers can be manufactured at low costs and a method of manufacturing such the printed circuit board assembly.

According to an embodiment, there is provided a printed circuit board assembly containing plural printed circuit boards and a connection layer. The plural printed circuit boards are mechanically and electrically connected to each other with them being stacked. The connection layer connects the adjacent two printed circuit boards to each other. The connection layer includes an insulation portion and an electric conduction portion. The insulation portion contains an insulating member and is adhered to each of the adjacent two printed circuit boards. The electric conduction portion passes through the insulation portion and connects electrode terminals of the adjacent two printed circuit boards.

The printed circuit board assembly according to an embodiment is, for instance, manufactured as following: first, the printed circuit boards to be connected are stacked at a predetermined position via the connection layer; the printed circuit boards and the connection layer thus stacked are then clamped with two plate-like elastic members; and these two plate-like elastic members apply any set pressure to the printed circuit boards and the connection layer thus stacked under a predetermined temperature. This enables the printed circuit boards to be adhered to the insulation portion of the connection layer as well as the electrode terminals of the printed circuit boards to be connected to each other through the electric conduction portion of the connection layer, thereby connecting the printed circuit boards to each other mechanically and electrically.

It is to be noted that each of the printed circuit boards to be connected has plural layers and is made according to any related technology such as the build-up technology.

In the printed circuit board assembly according to this embodiment, the printed circuit boards each having plural layers that have been made according to any related technology are mechanically and electrically connected to each other via the connection layer having the electric conduction portion that electrically connects the printed circuit boards to each other. This enables the multi-layered printed circuit board assembly in which plural printed circuit boards are connected to each other to be manufactured at low costs.

According to another embodiment, there is provided a method of manufacturing a printed circuit board assembly containing plural printed circuit boards and a connection layer. The printed circuit boards are mechanically and electrically connected to each other through the connection layer with them being stacked. The connection layer includes an insulation portion and an electric conduction portion. The insulation portion is adhered to each of the adjacent two printed circuit boards and the electric conduction portion connects electrode terminals of the adjacent two printed circuit boards. The electric conduction portion includes an electrical conducting paste that contains a low-melting metal particle and a high-melting metal particle. The electrical conducting paste is coupled to metal other than the metal particles by using metallizing technology that connects metals to each other by applying predetermined pressure under a predetermined temperature. The method includes the steps of stacking the printed circuit boards to be connected via the connection layer at a predetermined position, clamping the printed circuit boards and the connection layer thus stacked by means of two plate-like elastic members, and applying predetermined pressure to the printed circuit boards and the connection layer thus stacked by these two elastic members under a predetermined temperature to connect the printed circuit boards and the connection layer to each other.

In the method of manufacturing the printed circuit board assembly according to this embodiment, the printed circuit boards to be connected are first stacked at a predetermined position via the connection layer. It is to be noted that each of the printed circuit boards to be connected has plural layers and is made according to any related technology such as the build-up technology.

The printed circuit boards and the connection layer thus stacked are then clamped with two plate-like elastic members. These two plate-like elastic members apply any set pressure to the printed circuit boards and the connection layer thus stacked under a predetermined connection temperature.

This enables the printed circuit boards to be adhered to the insulation portion of the connection layer. The low-melting metal particle in the electrical conducting paste of the electric conduction portion also changes to its liquid one. This facilitates metallizing the low-melting metal particle and the high-melting metal particle in the electrical conducting paste with the electrode terminals of the printed circuit boards, thereby connecting the electrode terminals of the printed circuit boards to the electric conduction portion of the connection layer, which allows the printed circuit boards to be mechanically and electrically connected to each other.

According to the method of manufacturing the printed circuit board assembly according to this embodiment, the printed circuit boards each having plural layers that have been made according to any related technology are stacked via the connection layer having the electric conduction portion that electrically connects the printed circuit boards to each other and are mechanically and electrically connected to each other by means of applying temperature and pressure thereto. This enables the multi-layer printed circuit board assembly in which plural printed circuit boards are connected to each other to be manufactured at low costs.

Additional features and advantages are described herein, and will be apparent from, the following Detailed Description and the figures.

BRIEF DESCRIPTION OF THE FIGURES

FIGS. 25A through 25F are diagrams each for showing how to make a connection layer.

DETAILED DESCRIPTION

The following will describe preferred embodiments of a printed circuit board assembly in accordance with the present application and a method of manufacturing the printed circuit board assembly with reference to the accompanying drawings. First, embodiments of the printed circuit board assembly will be described.

Figure 1:
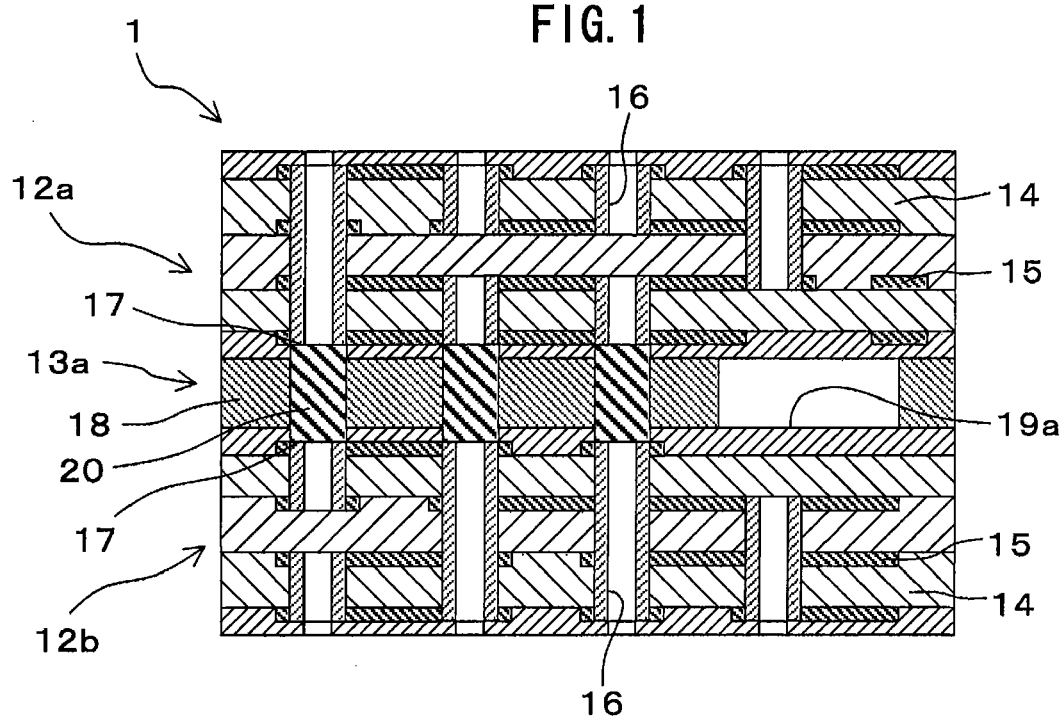
FIG. 1 is a cross-sectional view of a printed circuit board assembly according to a first embodiment.

FIG. 1 shows a printed circuit board assembly 1 according to a first embodiment. As shown in FIG. 1, the printed circuit board assembly 1 as the first embodiment has a configuration such that printed circuit boards 12a, 12b are mechanically and electrically connected to each other through a connection layer 13a.

Each of the printed circuit boards 12a, 12b includes plural layers constituted of insulating layers 14 and wiring layers 15, and via-holes 16 through which signal lines are respectively wired to the wiring layers 15. Each of the printed circuit boards 12a, 12b also includes electrode terminals 17 on a surface thereof, which is connected to the connection layer 13a. The electrode terminals 17 are respectively connected to signal lines, a power layer, a ground layer and the like. The printed circuit boards 12a, 12b are manufactured according to an existing method of manufacturing a multilayer printed circuit board such as build-up technology. UV-curable epoxy resin is applied to the surfaces of the printed circuit boards 12a, 12b.

Figure 2:
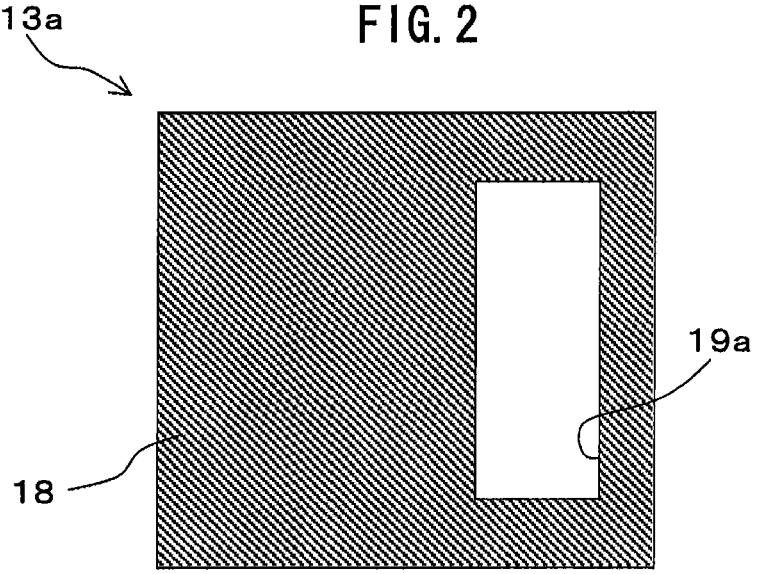
FIG. 2 is a plan view of a connection layer for illustrating a configuration of the connection layer shown in FIG. 1.
Figure 3:
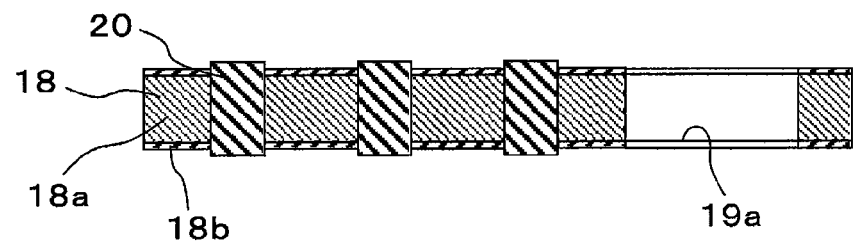
FIG. 3 is a sectional view of the connection layer for illustrating a detailed configuration of the connection layer shown in FIG. 1.

FIG. 2 is a plan view of the connection layer 13a that illustrates only an insulation portion 18 and a space 19a, which will be described. FIG. 3 is a sectional view of the connection layer 13a for showing a detailed configuration thereof. The connection layer 13a has a configuration such that it can contain the insulation portion 18 that is adhered to the printed circuit boards 12a, 12b when they are connected to each other, and an electric conduction portion 20 that connects the electrode terminals 17 of the printed circuit boards 12a, 12b to each other. The connection layer 13a also has the space 19a in which the insulation portion 18 and the electric conduction portion 20 are not formed. In the connection layer 13a of the printed circuit board assembly 1 as shown in FIGS. 1 and 2, the space 19a is formed so as to be pierced through the connection layer 13a. When the printed circuit boards 12a, 12b are assembled with them being connected to each other through the connection layer 13a as shown in FIG. 1, the space 19a is communicate up to a surface of each of the printed circuit boards 12a, 12b.

As shown in FIG. 3, the insulation portion 18 has a core member 18a and adhesive layers 18b through which the core member 18b adheres to the printed circuit boards 12a, 12b. It is to be noted that if the insulation portion 18 has any sufficient chemical affinity for the surface of each of the printed circuit boards 12a, 12b, any adhesive is not necessary therefor. The core member 18a is made of, for example, thermoplastic resin, which is insulating resin and has greater heat-resistance and an excellent dielectric characteristic. In this case, as the thermoplastic resin, it is possible to use the thermoplastic resin having any sufficient chemical affinity for the UV-curable epoxy resin applied to the surface of each of the printed circuit boards 12a, 12b. As the thermoplastic resin, for example, any thermoplastic resin film made of main raw materials of polyetheretherketone or a mixed composite of polyarylketone resin and amorphous polyetherimide is available.

Any adhesive having a sufficient chemical affinity for the UV-curable epoxy resin to be applied to the surface of each of the printed circuit boards 12a, 12b and the thermoplastic resin constituting the core member is available for the adhesive constituting the adhesive layer 18b. As the adhesive, for example, a mixture of alkylphenol compound and maleimido may be used. In this moment, the core member 18a and the adhesive layer 18b have a total thickness of 50 μm or more and only the adhesive layer 18b has a thickness of 10 μm or less.

Each of the electric conduction portions 20 includes electrical conducting paste that contains low-melting metal particle(s) and high-melting metal particle(s), and is coupled to the electrode terminal 17 of each of the printed circuit boards 12a, 12b by using metallizing technology which connects metals to each other by applying predetermined pressure thereto under a predetermined temperature. Thus, the metal particles constituting the electrical conducting paste include the low-melting metal particle(s) containing only tin substance or tin and other metal, which form(s) an alloy together with a conductor pattern of each of the printed circuit boards 12a, 12d, and the high-melting metal particle(s) containing at least cupper or silver that form(s) an alloy together with the low-melting metal particle(s).

The electrical conducting paste is made by adding any solvent into a resin that is a thermoplastic resin becoming plastic at a melting temperature of the low-melting metal particle(s) and stirring them and then, by adding the high-melting metal particle(s) and the low-melting metal particle (s) into stirred one and further, stirring them. For example, the electrical conducting paste is made as following: copper particles having an average particle diameter of 8 μm as the high-melting metal particles and lead-free solder alloy particles constituting a ratio of tin, 96.5%; silver, 3%; and copper, 0.5% as the low-melting metal particles are first added and stirred so that weight percent of copper/(tin and copper) can become 24%. Polyester resin as the thermoplastic resin is then added and mixed into them so that its volume can become 2% with respect to a total volume of the electrical conducting paste. Butyl carbitol, name of article, (diethylene glycol monobutyl ether) is used as solvent for its viscosity control.

Although the connection layer 13a has had the space 19a in the printed circuit board assembly 1 shown in FIGS. 1 through 3 according to the first embodiment, the connection layer 13a can have no space.

Figure 4:
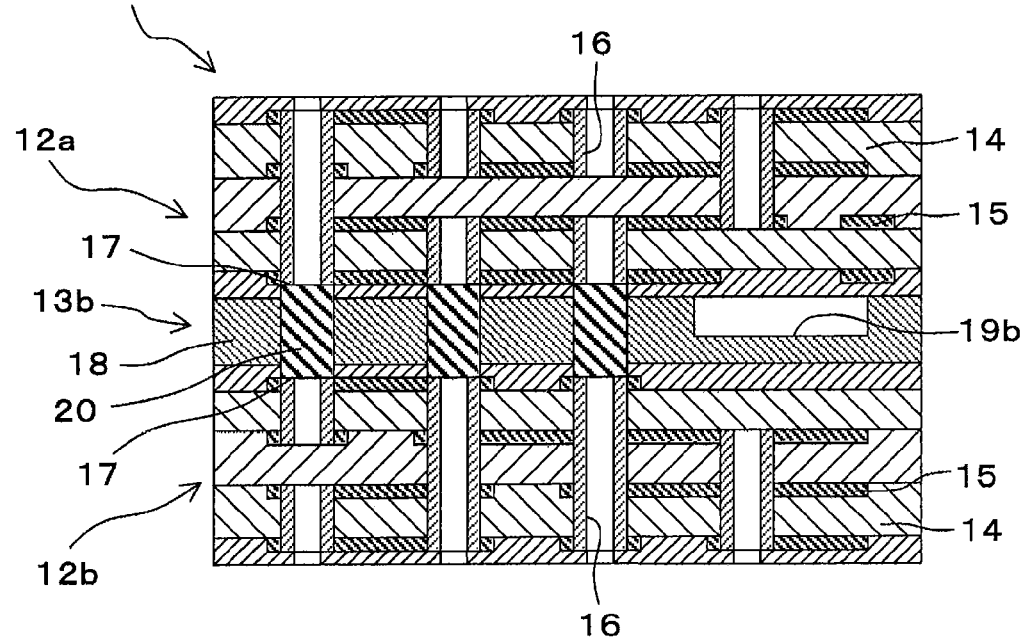
FIG. 4 is a cross-sectional view of a printed circuit board assembly according to a second embodiment.

FIG. 4 shows a printed circuit board assembly 2 according to a second embodiment of the present invention. Similar to the printed circuit board assembly 1, the printed circuit board assembly 2 also has a configuration such that the printed circuit boards 12a, 12b are mechanically and electrically connected to each other through the connection layer 13b.

The printed circuit board assembly 2 has the same configuration as that of the printed circuit board assembly 1 without only a configuration of the connection layer 13b. As shown in FIG. 4, the connection layer 13b in the printed circuit board assembly 2 has a space 19b that is formed by opening a part of a surface thereof, not piercing through the connection layer 13b. When the printed circuit boards 12a, 12b are thus connected to each other through the connection layer 13b, only the printed circuit board 12a faces the space 19b. Configurations of remaining parts in the printed circuit board assembly 2 are similar to those of the printed circuit board assembly 1.

Figure 5:
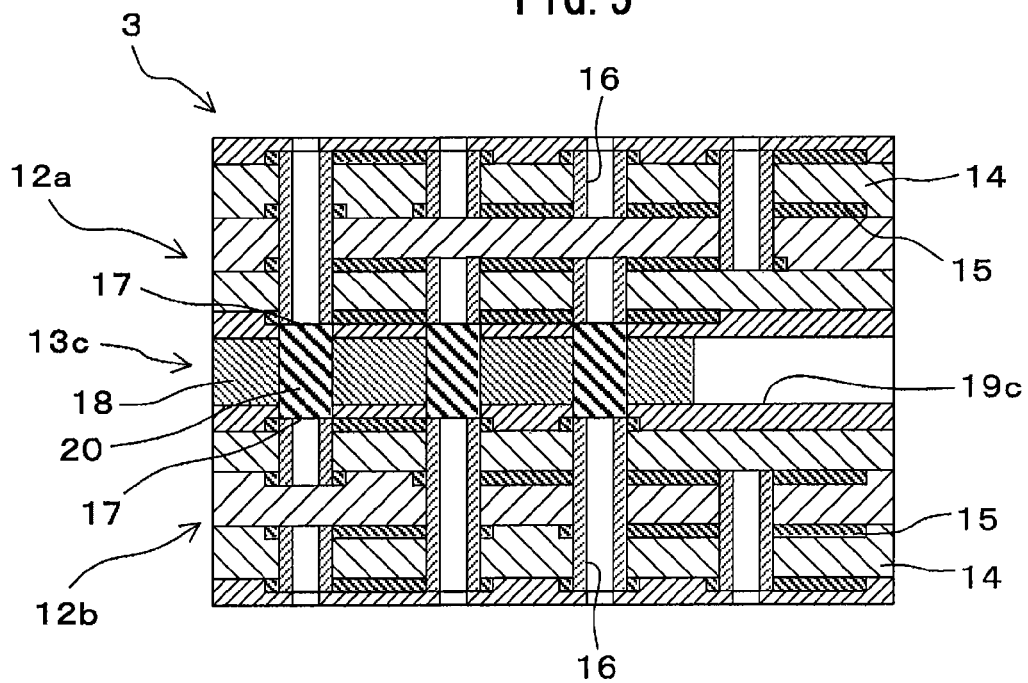
FIG. 5 is a cross-sectional view of a printed circuit board assembly according to a third embodiment.
Figure 6:
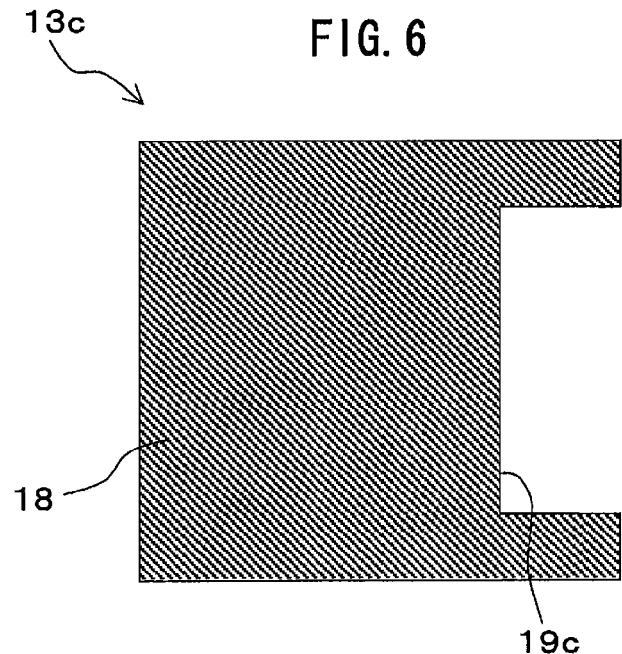
FIG. 6 is a plan view of a connection layer for illustrating a configuration of the connection layer shown in FIG. 5.

FIG. 5 shows a printed circuit board assembly 3 according to a third embodiment of the present invention. FIG. 6 is a plan view of a connection layer 13c shown in FIG. 5 and shows only the insulation portion 18 and a space 19c. Similar to the printed circuit board assemblies 1, 2, the printed circuit board assembly 3 further has a configuration such that the printed circuit boards 12a, 12b are mechanically and electrically connected to each other through the connection layer 13c.

The printed circuit board assembly 3 has the same configuration as that of each of the printed circuit board assemblies 1 and 2 without only a configuration of the connection layer 13c. As shown in FIGS. 5, 6, the connection layer 13c in the printed circuit board assembly 3 has a space 19c that is formed by opening a side end part of the connection layer 13c. When the printed circuit boards 12a, 12b are thus connected to each other through the connection layer 13c, the printed circuit boards 12a, 12b face the space 19b that is communicated to outside of the printed circuit board assembly 3. Configurations of remaining parts in the printed circuit board assembly 3 are similar to those of any of the printed circuit board assemblies 1, 2.

Figure 7:
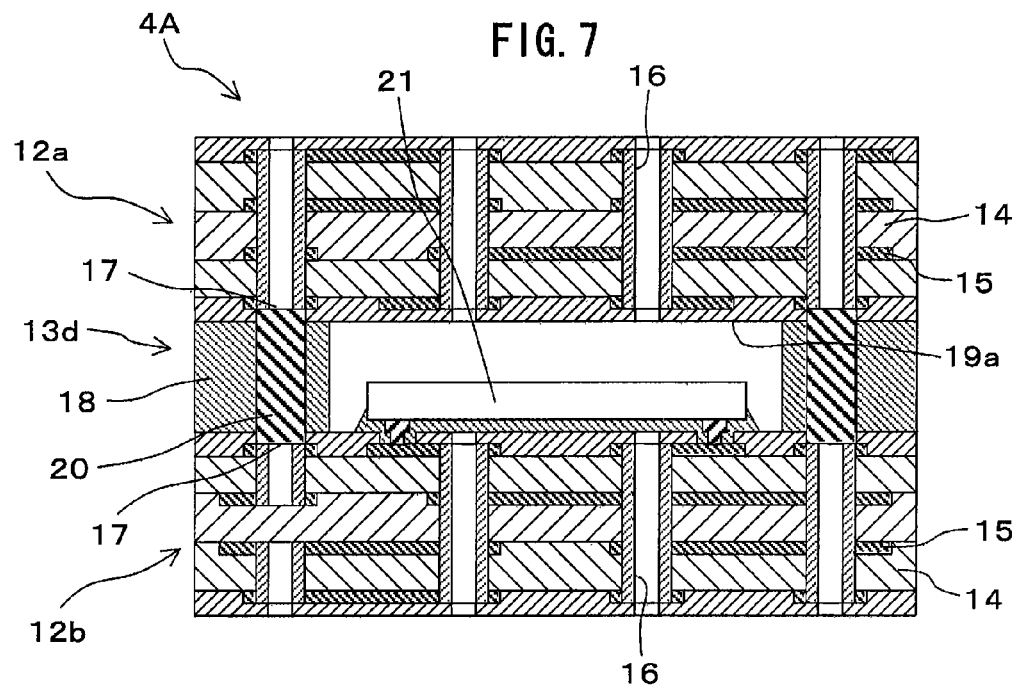
FIG. 7 is a cross-sectional view of a printed circuit board assembly according to a fourth embodiment.
Figure 8:
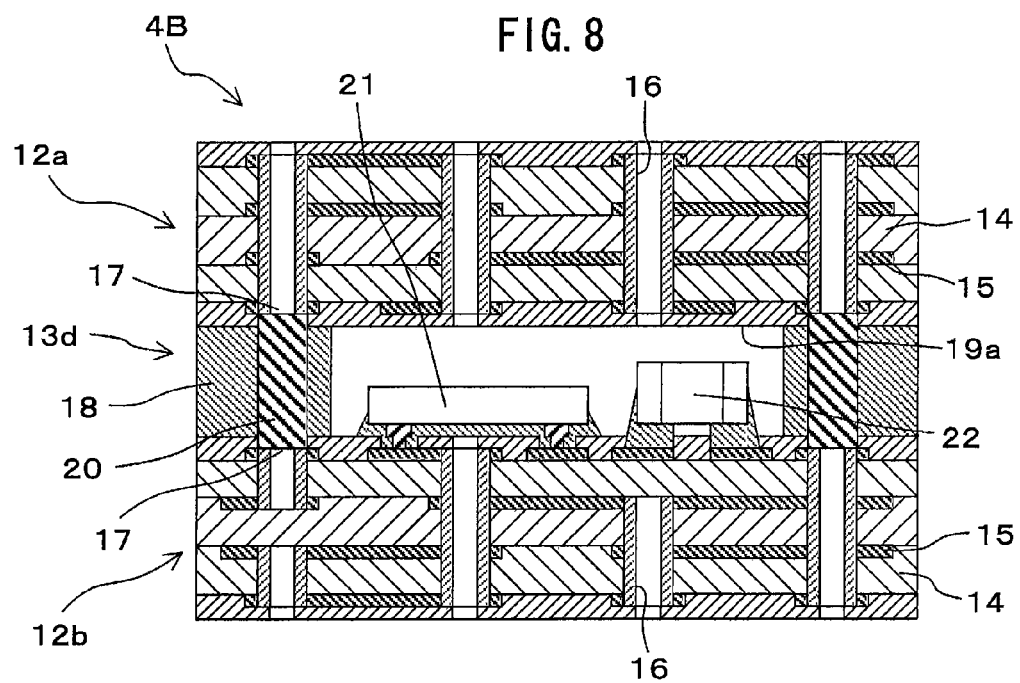
FIG. 8 is a cross-sectional view of a printed circuit board assembly according to the fourth embodiment.

FIGS. 7 and 8 show printed circuit board assemblies 4A, 4B each according to a fourth embodiment. FIG. 7 shows an example where an LSI 21 is mounted on the printed circuit board 12b so that the LSI 21 can be positioned inside the space 19a; and FIG. 8 shows an example where the LSI 21 and a chip component 22 are mounted on the printed circuit board 12b so that they can be positioned inside the space 19a. In these examples, the printed circuit board assemblies 4A, 4B, are equipped with electronic components, each inside the space 19a, which are connected to the printed circuit board 12b. As the equipped electronic components, as shown in FIGS. 7, 8, the LSI 21 or the common chip parts 22 such as chip capacitor may be illustrated. Configurations of remaining parts in each of the printed circuit board assemblies 4A, 4B are similar to those of the printed circuit board assembly 1. According to the printed circuit board assemblies 4A, 4B, the electronic components are positioned inside the space 19a that is formed between the printed circuit boards 12a, 12b, thereby allowing a mountable area of the electronic components to be increased. This enables the printed circuit board assemblies themselves to be downsized.

Figure 9:
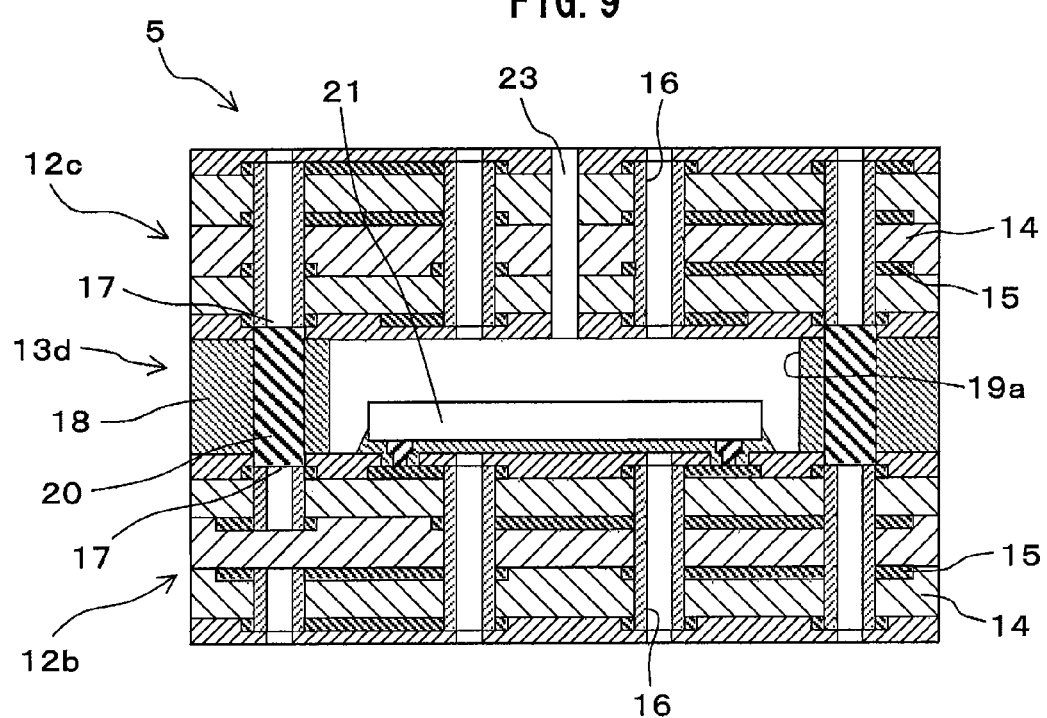
FIG. 9 is a cross-sectional view of a printed circuit board assembly according to a fifth embodiment.

FIG. 9 shows a printed circuit board assembly 5 according to a fifth embodiment of the present invention. Similar to the printed circuit board assemblies 4A, 4B, the printed circuit board assembly 5 is also equipped with any heating electronic components such as the LSI 21, each inside the space 19a. According to the printed circuit board assembly 5, a printed circuit board 12c contains an air inlet 23 that communicates the space 19a to outside of the printed circuit board assembly 5 to allow its air inlet. This enables cooling efficiency of the heating electronic components that are equipped inside the space 19a to be enhanced.

Figure 10A:
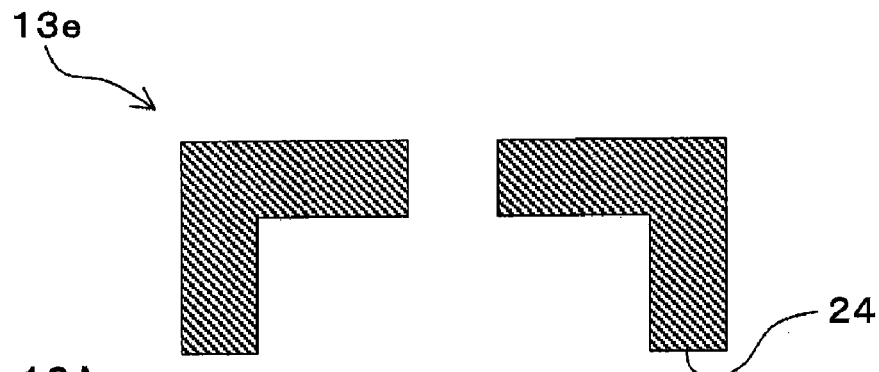
FIGS. 10A and 10B are diagrams each for showing a configuration of a connection layer.
Figure 10B:
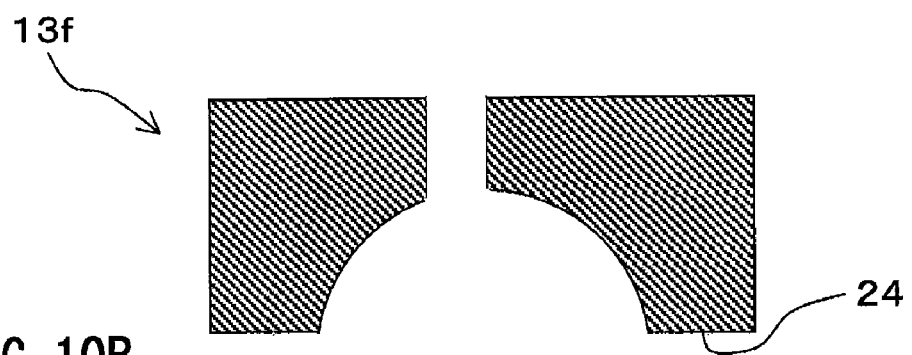

FIGS. 10A and 10B are plan views each for showing a configuration of a connection layer 13e or 13f as other example in the printed circuit board assembly 5. As shown in FIGS. 10A, 10B, the connection layer 13e or 13f contains an air inlet 24 that communicates the space 19a to outside of the printed circuit board assembly 5, thereby allowing cooling efficiency of the heating electronic components that are equipped inside the space 19a to be enhanced.

In the printed circuit board assembly 5, electronic components are positioned inside the space 19a formed between the printed circuit boards 12a and 12b similar to the printed circuit board assemblies 4A, 4B, thereby allowing a mountable area of the electronic components to be increased. This enables the printed circuit board assembly itself to be downsized. Configurations of remaining parts in the printed circuit board assembly 5 are similar to those of any of the printed circuit board assemblies 4A, 4B.

Figure 11:
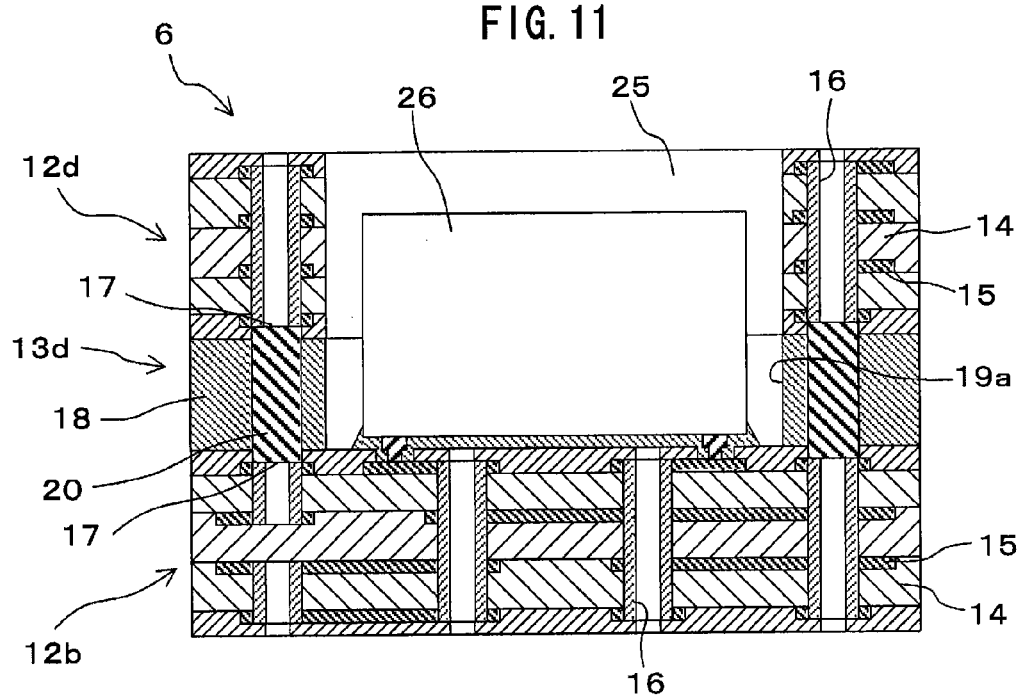
FIG. 11 is a cross-sectional view of a printed circuit board assembly according to a sixth embodiment.

FIG. 11 shows a printed circuit board assembly 6 according to a sixth embodiment. The printed circuit board assembly 6 has an opening 25 in the printed circuit board 12d above the space 19a of the connection layer 13d. Such a configuration allows a so-called cavity structure to be formed so that a tall component 26 such as tall electronic component that connects the printed circuit board 12b can be mounted on the printed circuit board 12b so that the tall component 26 can be positioned inside the opening 15 and the space 19a. This enables the printed circuit board assembly itself to be reduced in profile thereof as a whole. As the tall component 26, LSI equipped with a heat sink may be positioned.

Figure 12:
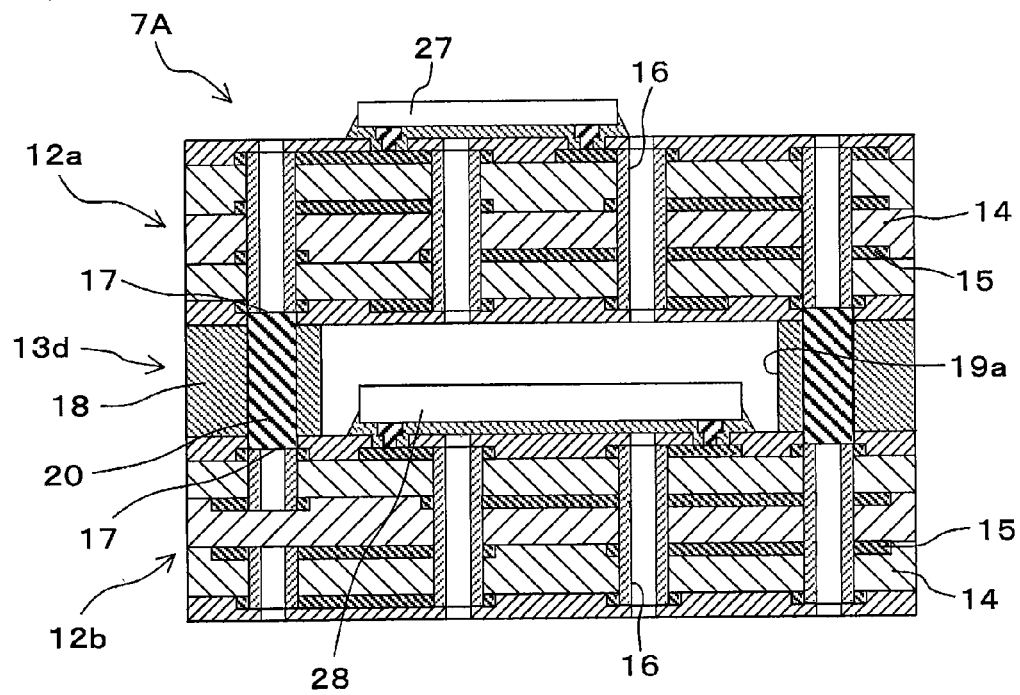
FIG. 12 is a cross-sectional view of a printed circuit board assembly according to a seventh embodiment.
Figure 13:
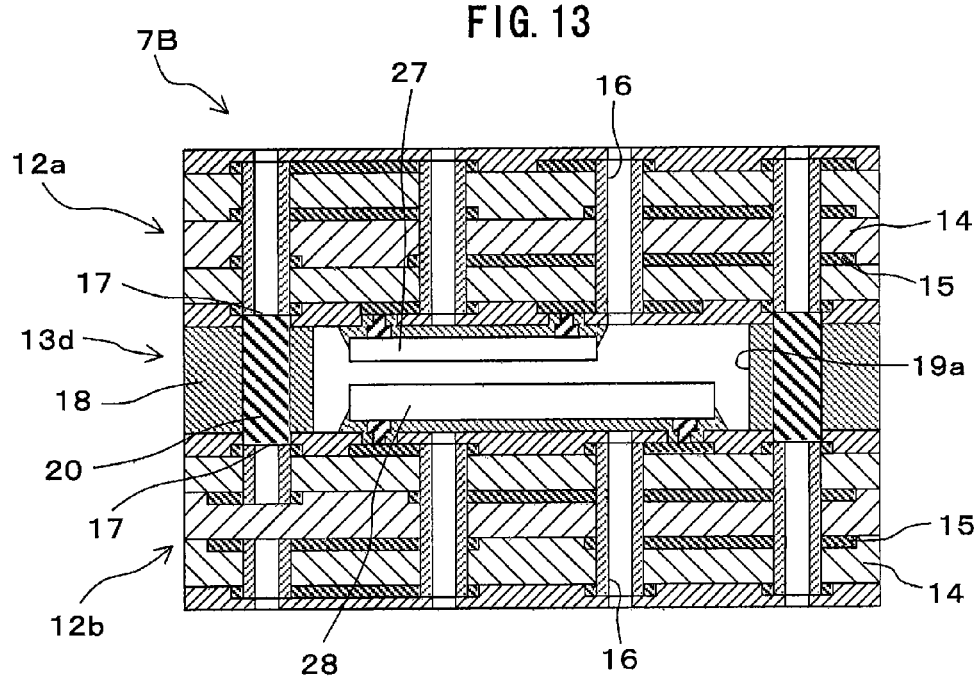
FIG. 13 is a cross-sectional view of a printed circuit board assembly according to the seventh embodiment.
Figure 14:
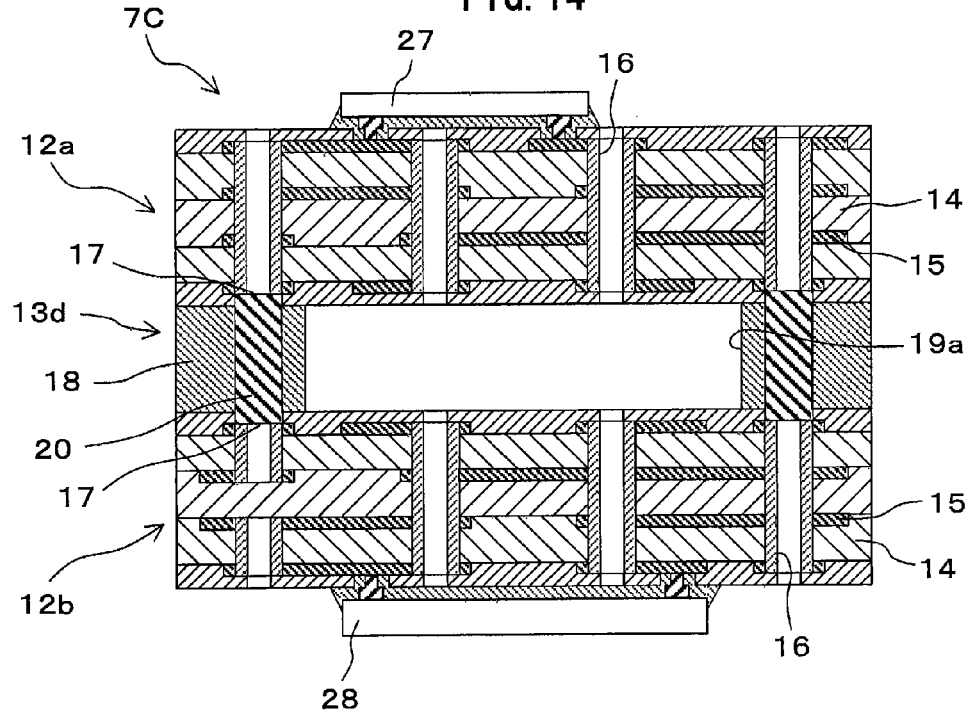
FIG. 14 is a cross-sectional view of a printed circuit board assembly according to the seventh embodiment.

FIGS. 12 through 14 show printed circuit board assemblies 7A through 7C, each assembly being configured according to a seventh embodiment. In the printed circuit board assemblies 7A through 7C, the printed circuit board 12a is equipped with a low-frequency LSI 27 that operates at low frequency as input/output of signal and the printed circuit board 12b is equipped with a high-frequency LSI 28 that operates at high frequency as input/output of signal. In the printed circuit board assemblies 7A through 7C, the low-frequency LSI 27 and the high-frequency LSI 28 are positioned so that air portion (hereinafter referred to as "air layer") in the space 19a can be put between them.

In the printed circuit board assembly 7A shown in FIG. 12, the low-frequency LSI 27 is mounted on the outermost layer of the printed circuit board 12a, which forms a surface of the printed circuit board assembly 7A, and the high-frequency LSI 28 is mounted on the printed circuit board 12b so that the high-frequency LSI 28 can be positioned inside the space 19a.

In the printed circuit board assembly 7B shown in FIG. 13, the low-frequency LSI 27 is implemented under the printed circuit board 12a and the high-frequency LSI 28 is mounted on the printed circuit board 12b so that the low-frequency LSI 27 and the high-frequency LSI 28 can be positioned inside the space 19a.

In the printed circuit board assembly 7C shown in FIG. 14, the low-frequency LSI 27 is mounted on the outermost layer of the printed circuit board 12a, which forms a surface of the printed circuit board assembly 7C, and the high-frequency LSI 28 is implemented under the outermost layer of the printed circuit board 12b, which forms a surface of the printed circuit board assembly 7C. In the printed circuit board assemblies 7A through 7C, the low-frequency LSI 27 and the high-frequency LSI 28 are thus positioned so that the air layer in the space 19a can be put between them.

Such a configuration that the high-frequency LSI 28 is apt to generate an electromagnetic wave noise and the low-frequency LSI 27 is apt to receive the electromagnetic wave noise are positioned through the air layer having a low dielectric constant allows any influence of the electromagnetic wave noise to be suppressed. In a case of any electronic components other than the low-frequency LSI 27 and the high-frequency LSI 28, for example, if electronic components such as high power circuit components and digital circuit components that are apt to generate an electromagnetic wave noise and electronic components such as low power circuit components and analog circuit components that are apt to receive the electromagnetic wave noise are positioned through the air layer, it is also possible to suppress any influence by the electromagnetic wave noise similar to the above. It is to be noted that the low-frequency LSI 27 is one example of the low frequency circuit components and the high-frequency LSI 28 is one example of the high frequency circuit components.

Although the connection layer 13d has had the space 19a in the printed circuit board assembly 7C as shown in FIG. 14, the connection layer 13d may have no space and the core member 18a of the insulation portion 18 can be made of thermoplastic resin having a lower dielectric constant than those of the printed circuit boards 12a, 12b, thereby enabling any influence of the electromagnetic noise to be suppressed similar to the above. Configurations of remaining parts in the printed circuit board assemblies 7A through 7C are similar to those of the printed circuit board assembly 1.

Figure 15:
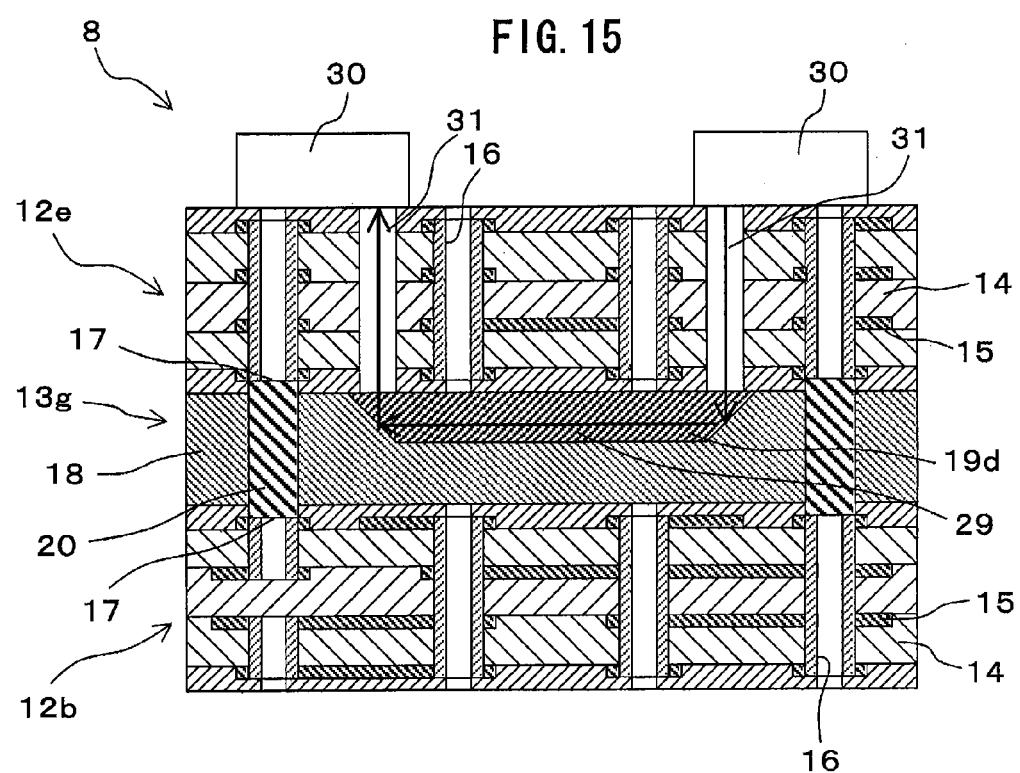
FIG. 15 is a cross-sectional view of a printed circuit board assembly according to an eighth embodiment.

FIG. 15 shows a printed circuit board assembly 8 according to an eighth embodiment. An optical waveguide 29 made of resin is formed inside the space 19d in the printed circuit board assembly 8. Optical connectors 30, 30 are mounted on the outermost layer of the printed circuit board 12e, which forms a surface of the printed circuit board assembly 8. Joint portions 31, 31 that optically joint the optical connectors 30, 30 and the optical waveguide 29 are formed in the printed circuit board 12e. Such a configuration allows an optical signal to propagate as arrows shown in FIG. 15, thereby enabling an optical circuit to be configured without any additional module for the optical waveguide. This allows a whole of the printed circuit board assembly to be downsized and light-weighted. It is to be noted that the optical connector 30 is an example of optical element. As the optical element, an optical element having a light-emitting element, a light-receiving element and the like can be used. Configurations of remaining parts in the printed circuit board assembly 8 are similar to those of the printed circuit board assembly 1.

Figure 16:
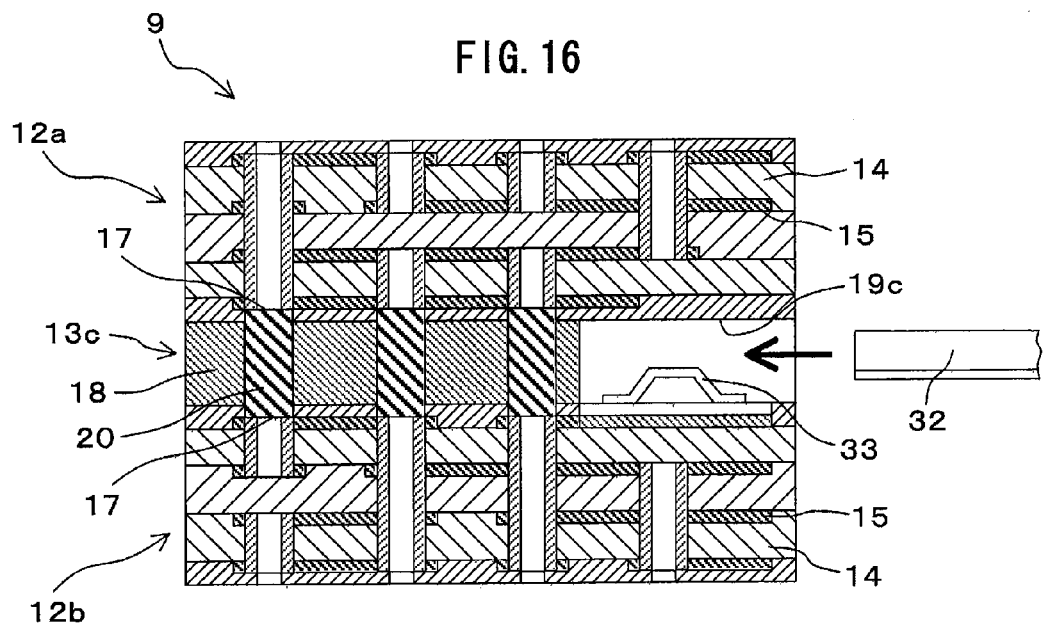
FIG. 16 is a cross-sectional view of a printed circuit board assembly according to a ninth embodiment.
Figure 17:
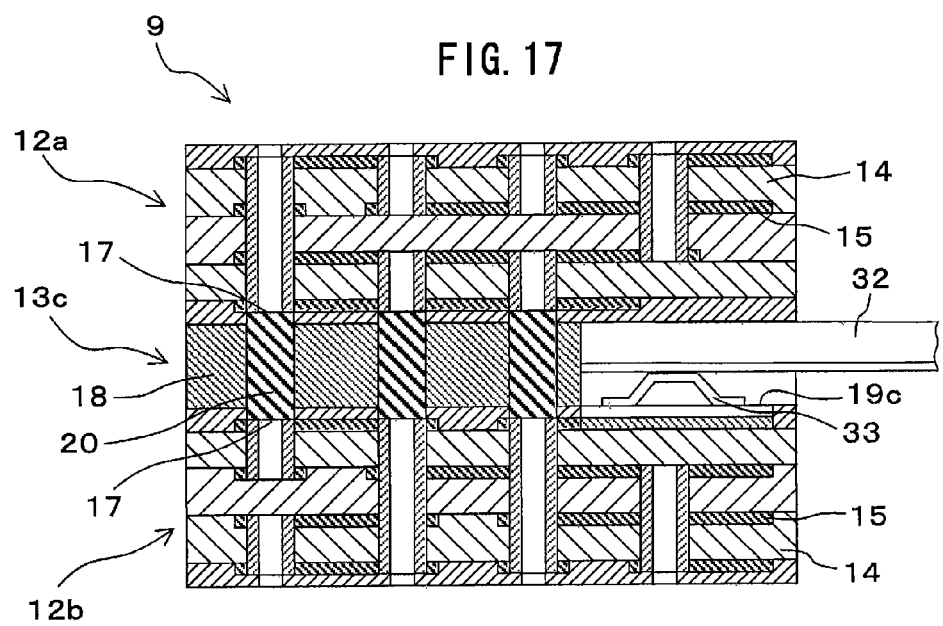
FIG. 17 is a cross-sectional view of the printed circuit board assembly according to the ninth embodiment.
Figure 18:
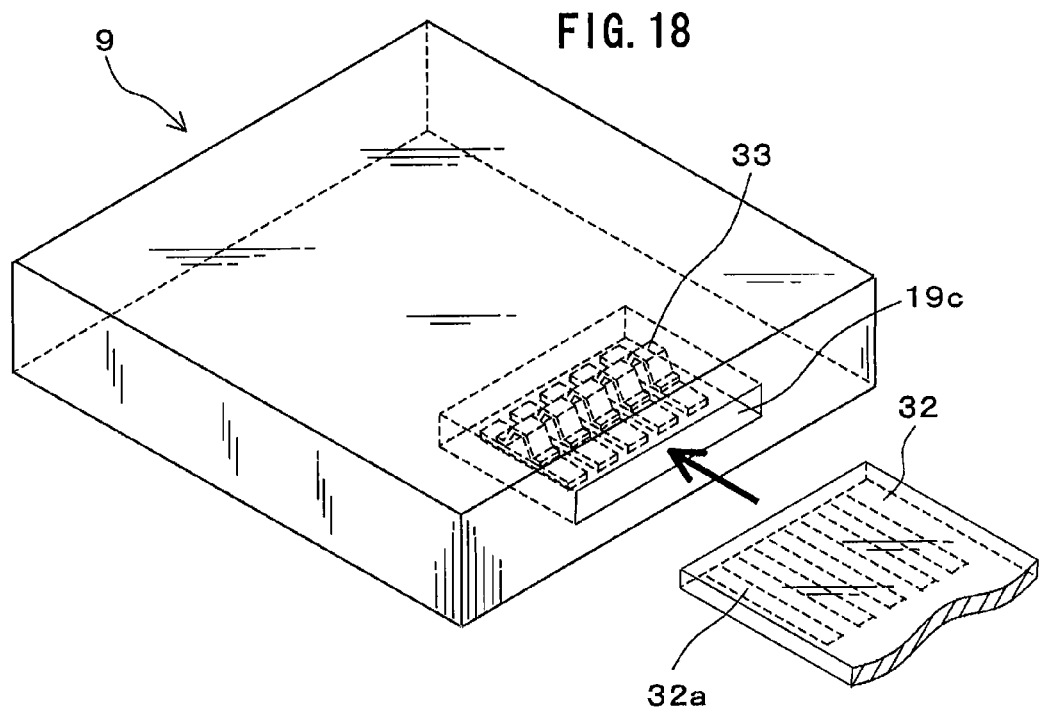
FIG. 18 is a perspective view of the printed circuit board assembly according to the ninth embodiment.
Figure 19:
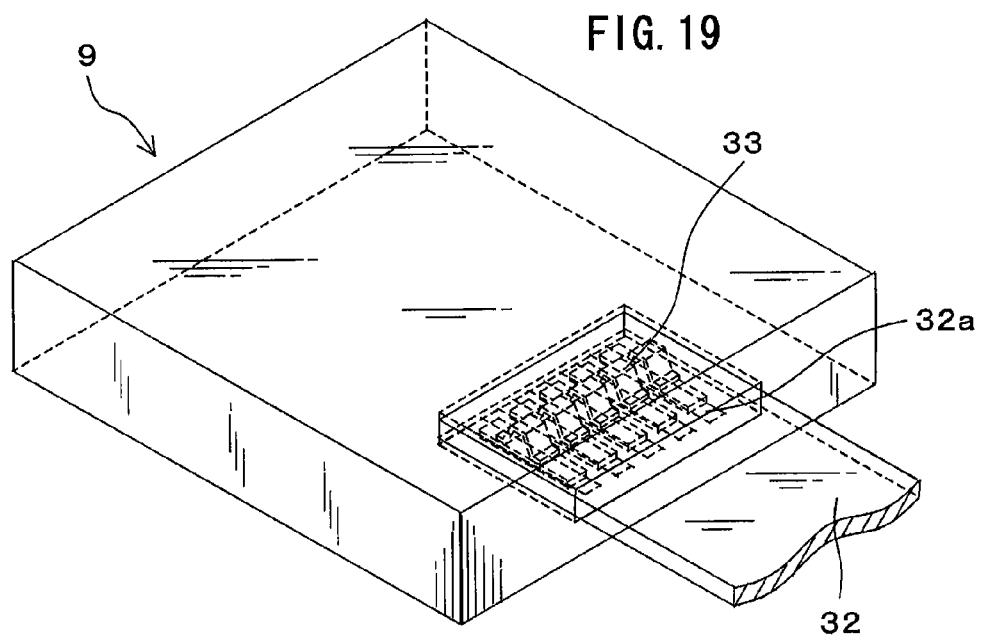
FIG. 19 is a perspective view of the printed circuit board assembly according to the ninth embodiment.
Figure 20:
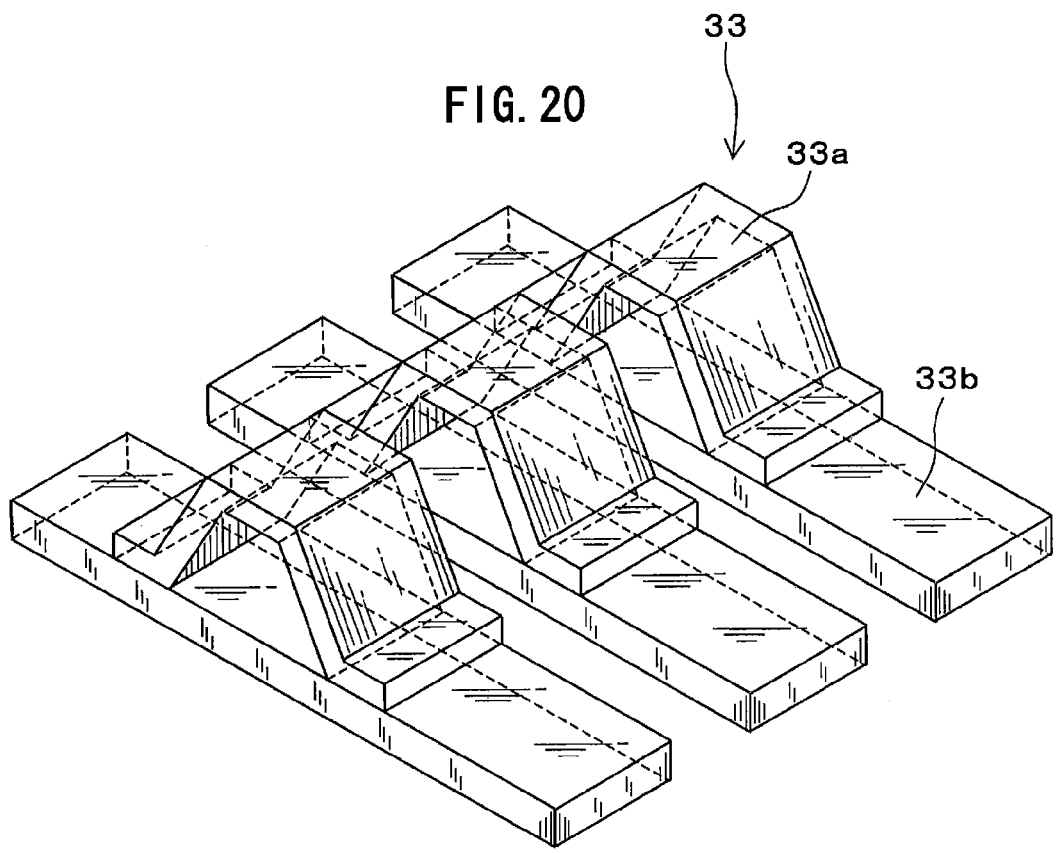
FIG. 20 is a perspective view of connection pins.

FIGS. 16 through 19 show a configuration of a printed circuit board assembly 9 according to a ninth embodiment of the present invention. FIG. 16 is a cross-sectional view of the printed circuit board assembly 9 into which a flexible printed circuit board 32, which will be described later, has not yet been inserted. FIG. 17 is a cross-sectional view of the printed circuit board assembly 9 into which the flexible printed circuit board 32 has already been inserted. FIG. 18 shows the printed circuit board assembly 9 into which the flexible printed circuit board 32 has not yet been inserted. FIG. 19 shows the printed circuit board assembly 9 into which the flexible printed circuit board 32 has already been inserted. FIG. 20 shows a configuration of connection pins 33, which will be described later.

The printed circuit board assembly 9 contains connection pins 33 that are mounted on and connected to the printed circuit board 12b so that they can be positioned inside the space 19a, in addition to the printed circuit board assembly 3 shown in FIG. 5.

As shown in FIG. 20, each of the connection pins 33 contains a trapezoid-like connection portion 33a that connects a connection terminal 32a of the flexible printed circuit board 32 and a plate-like base portion 33b that is fixed on the printed circuit board 12b with solder. The connection portion 33a has such a structure that it is elastically deformable by means of downwardly applied force. In the printed circuit board assembly 9, the connection pins 33 are fixed on the printed circuit board 12b at predetermined intervals inside the space 19a. Configurations of remaining parts in the printed circuit board assembly 9 are similar to those of the printed circuit board assembly 3.

As shown in FIGS. 16 through 19, such a configuration allows the flexible printed circuit board 32 having a predetermined thickness to be inserted into or taken out of the space 19c of the flexible printed circuit board assembly 9. When the flexible printed circuit board 32 is inserted into the space 19c, the connection terminal 32a of the flexible printed circuit board 32 is connected with the connection portion 33a of each of the connection pins 33 to establish their electrical continuity. In this moment, the connection portion 33a pushes the flexible printed circuit board 32 against the printed circuit board 12a. This enables the flexible printed circuit board 32 to be fixed to the printed circuit board assembly 9. Such the fixation that the flexible printed circuit board 32 is fixed to the printed circuit board assembly 9 by means of the push by the connection portion 33a of each of the connection pins 33 is one example of fixing method of fixing the flexible printed circuit board 32 on the printed circuit board assembly 9. Another fixation such that the flexible printed circuit board 32 is fixed to the printed circuit board assembly 9 can be separately configured.

Thus, in the printed circuit board assembly 9, it is possible to connect the flexible printed circuit board 32 to the printed circuit board assembly 9 electrically and fix them by inserting the flexible printed circuit board 32 into the printed circuit board assembly 9. This allows any connector to be made unnecessary for being set on a surface of the printed circuit board or the like, thereby enabling a whole of the printed circuit board assembly to be downsized and light-weighted.

Figure 21:
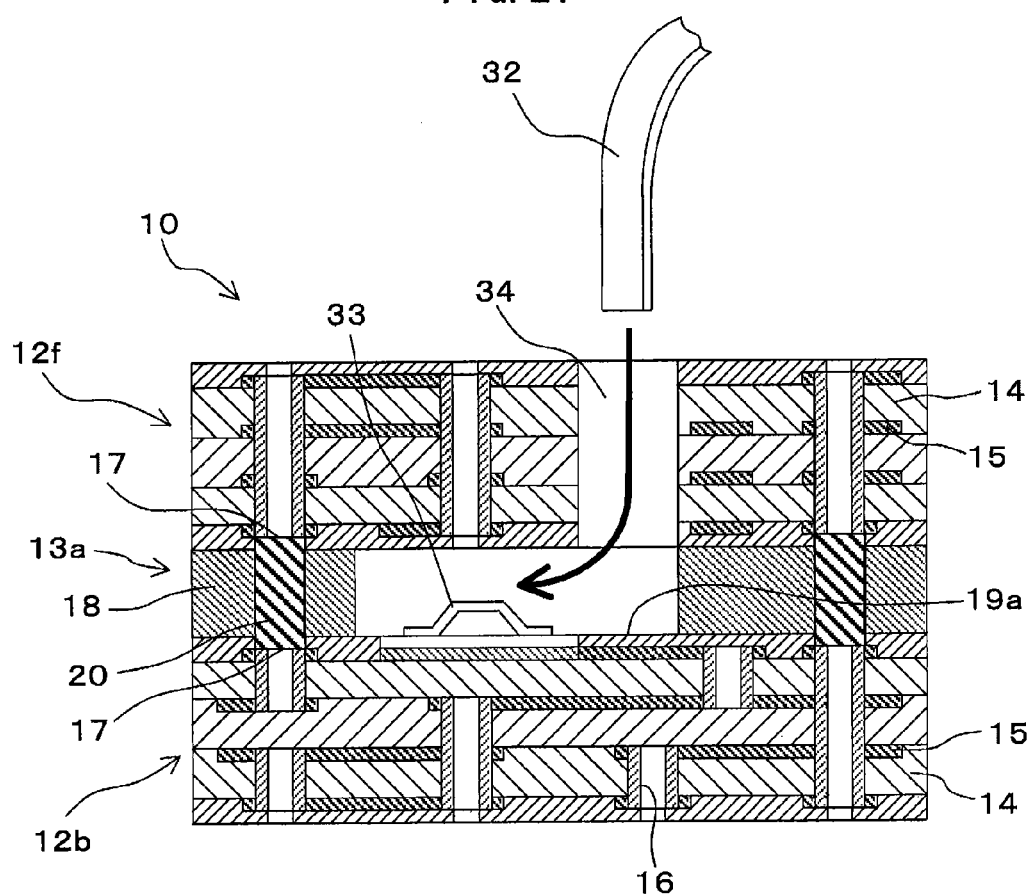
FIG. 21 is a cross-sectional view of a printed circuit board assembly according to a tenth embodiment.
Figure 22:
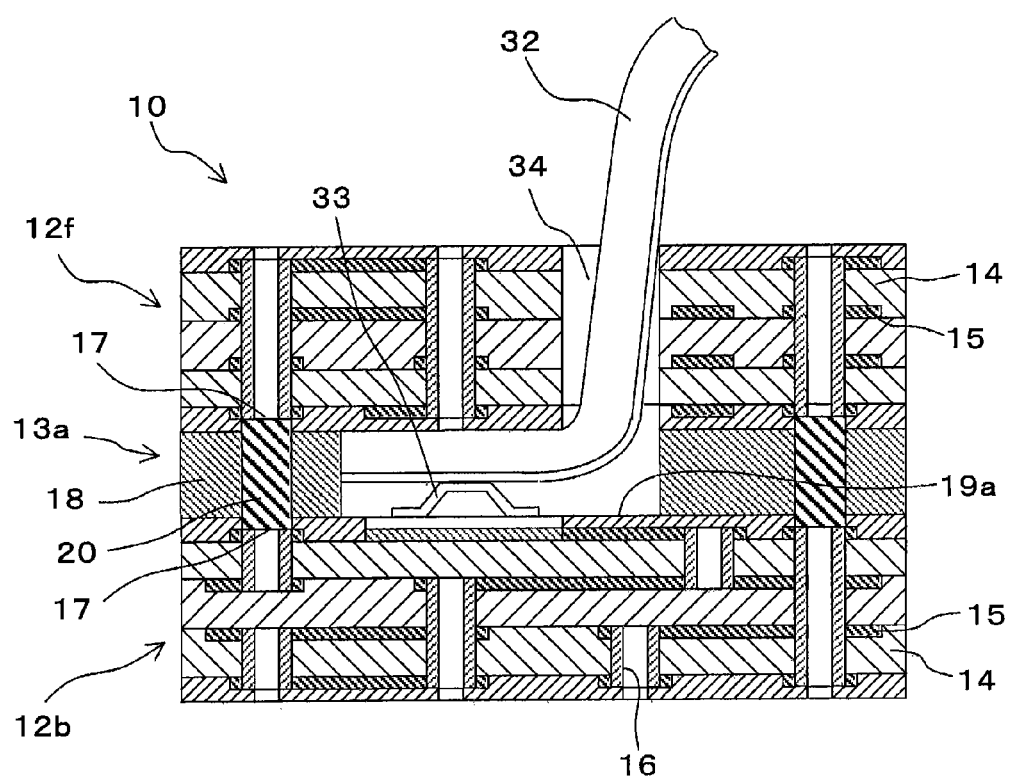
FIG. 22 is a cross-sectional view of the printed circuit board assembly according to the tenth embodiment.
Figure 23:
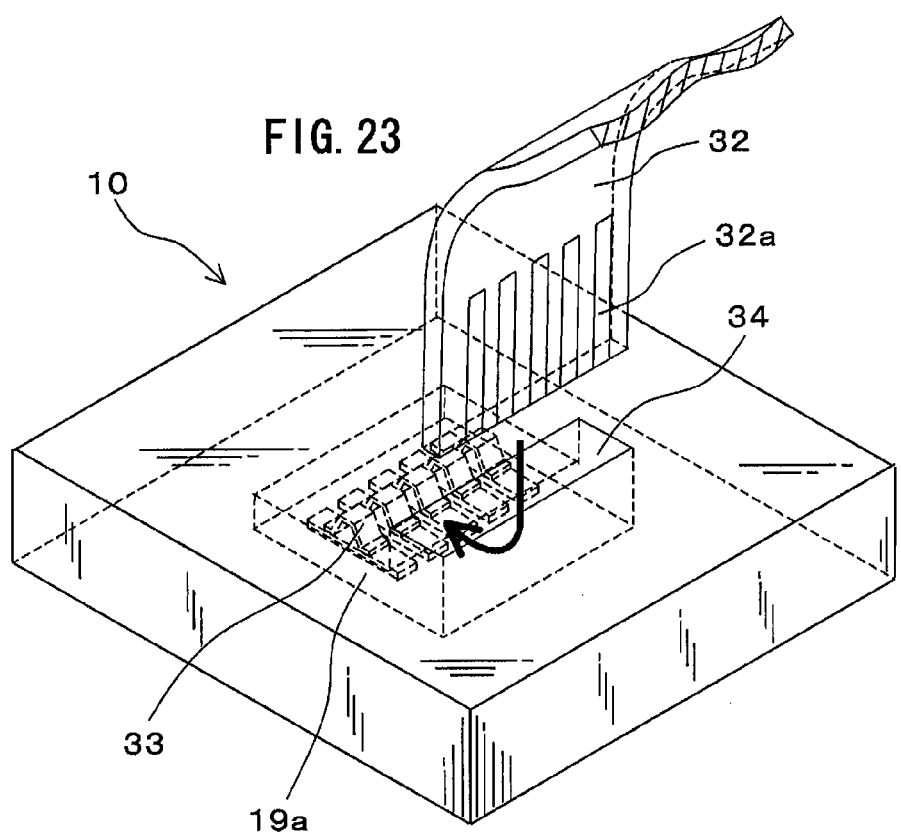
FIG. 23 is a perspective view of the printed circuit board assembly according to the tenth embodiment.
Figure 24:
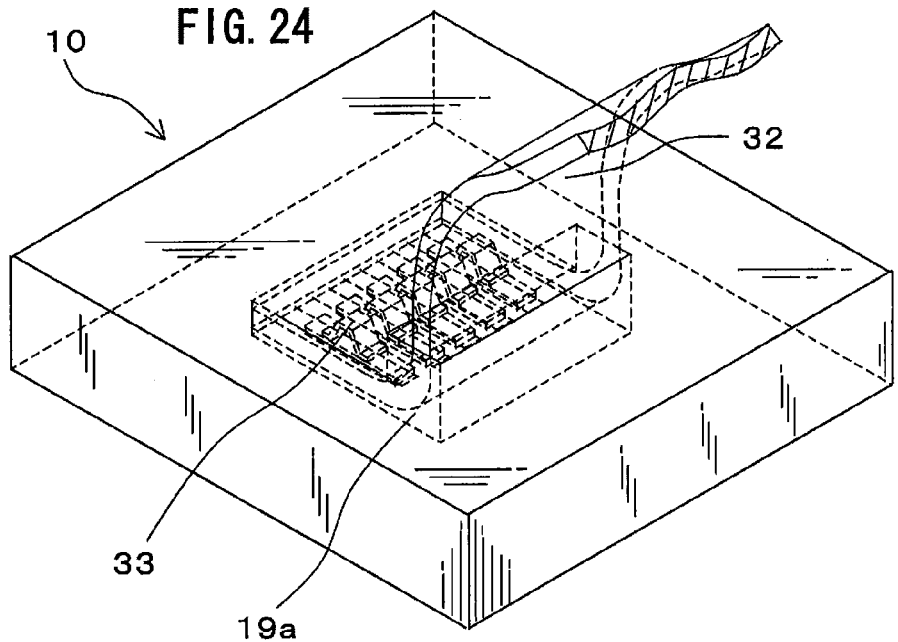
FIG. 24 is a perspective view of the printed circuit board assembly according to the tenth embodiment.
Figure 26A:
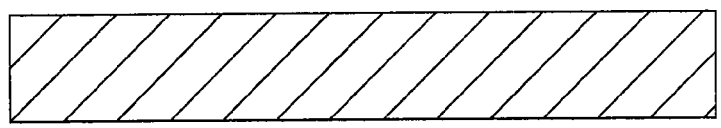
FIGS. 26A through 26E are diagrams each for showing how to manufacture a printed circuit board assembly.
Figure 26B:
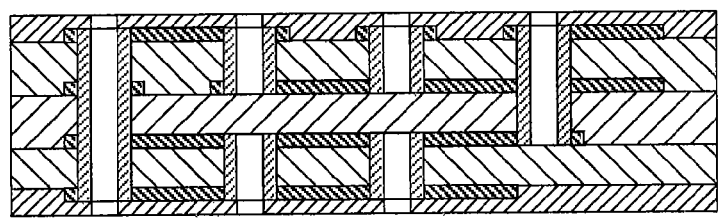
Figure 26C:
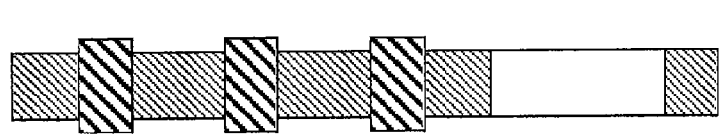
Figure 26D:
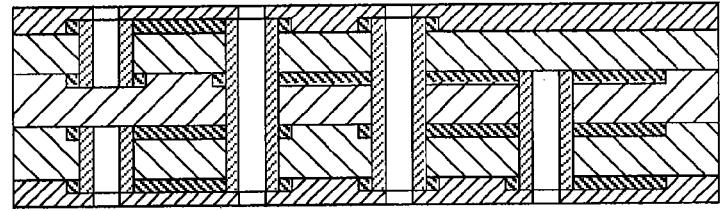
Figure 26E:

FIGS. 21 through 24 show a configuration of a printed circuit board assembly 10 according to a tenth embodiment of the present invention. FIG. 21 is a cross-sectional view of the printed circuit board assembly 10 into which the flexible printed circuit board 32 has not yet been inserted. FIG. 22 is a cross-sectional view of the printed circuit board assembly 10 into which the flexible printed circuit board 32 has already been inserted. FIG. 23 shows the printed circuit board assembly 10 into which the flexible printed circuit board 32 has not yet been inserted. FIG. 24 shows the printed circuit board assembly 10 into which the flexible printed circuit board 32 has already been inserted.

The printed circuit board assembly 10 contains connection pins 33, shown in FIG. 20, that are mounted on the printed circuit board 12b so that they can be positioned inside the space 19a, in addition to the printed circuit board assembly 1 shown in FIG. 1. The connection pins 33 are fixed on the printed circuit board 12b at predetermined intervals. In the printed circuit board assembly 10, the printed circuit board 12f has an opening 34 formed to a predetermined form, by which the space 19a is communicated to outside of the printed circuit board assembly 10. Configurations of remaining parts in the printed circuit board assembly 10 are similar to those of the printed circuit board assembly 1.

As shown in FIGS. 21 through 24, such a configuration allows the flexible printed circuit board 32 having a predetermined thickness to be inserted into or taken out of the space 19a of the printed circuit board assembly 10 through the opening 34. Similar to the printed circuit board assembly 8, when the flexible printed circuit board 32 is inserted into the space 19a, the connection terminal 32a of the flexible printed circuit board 32 is connected with the connection portion 33a of each of the connection pins 33 to establish their electrical continuity. In this moment, the connection portion 33a pushes the flexible printed circuit board 32 against the printed circuit board 12a, which is similar to the above embodiment. This enables the flexible printed circuit board 32 to be fixed to the printed circuit board assembly 10. Such the fixation that the flexible printed circuit board 32 is fixed to the printed circuit board assembly 10 by means of the push by the connection portion 33a of each of the connection pins 33 is one example of fixing method of fixing the flexible printed circuit board 32 on the printed circuit board assembly 10. Another fixation that the flexible printed circuit board 32 is fixed to the printed circuit board assembly 10 can be separately configured.

Thus, in the printed circuit board assembly 10, it is possible to connect the flexible printed circuit board 32 to the printed circuit board assembly 10 electrically and fix them by inserting the flexible printed circuit board 32 into the printed circuit board assembly 10. This allows any connector to be unnecessary for being set on a surface of the printed circuit board or the like, thereby enabling a whole of the printed circuit board assembly to be downsized and light-weighted.

The printed circuit board assemblies 9 and 10 can be respectively varied and used according to any connection configurations of the printed circuit board assembly to the flexible printed circuit board. The printed circuit board assemblies 9 and 10 can be combined. The flexible printed circuit board 32 can be connected to an upper surface, a bottom surface, and any of side surfaces of the printed circuit board assembly.

Although two printed circuit boards have been connected to each other through the connection layer in the above printed circuit board assemblies 1 through 10, this invention is not limited thereto. The printed circuit boards of three or more may be stacked and connected to each other through the connection layers.

The following will describe the method of manufacturing the printed circuit board assembly according to embodiments with reference to the attached drawings. FIGS. 25A through 25F show how to make the connection layer 13 (13a through 13g) in which sectional views of the connection layer 13 are shown. As shown in FIG. 25A, a thermoplastic film 18*c* constituting the core member 18*a* is prepared. The thermoplastic film 18*c* is, for example, an insulating resin and has greater heat-resistance and an excellent dielectric characteristic, as described above.

As shown in FIG. 25B, an adhesive constituting the adhesive layer 18*b* is then applied to both surfaces of the thermoplastic film 18*c*. The adhesive made of, for example, a mixture of alkylphenol compound and maleimido is used as described above. Release films 18*d* having any low adhesion are then stuck on surfaces of the adhesive layer 18*b*. As the release films 18*d*, for example, polyethylene terephthalate films each having a thickness from 20 μm to 50 μm is used. This release film 18*d* is one example of the protect film.

As shown in FIG. 25C, through-holes 13*h* are then drilled or pierced at a predetermined positions in the thermoplastic film 18*c* having the adhesive layers 18*b* and the release films 18*d* by using a drill machining or a laser processing in order to establish the electrical continuity portion 20.

As shown in FIG. 25E, the electrical conducting paste is filled into the through-holes 13*h* with any squeegee printing after the through-holes 13*h* have been formed. The thermoplastic film 18*c* in which the electrical conducting paste is filled is then dried by an oven so that the electrical conducting paste is solidified. As the electrical conducting paste, the above-mentioned one is used.

As shown in FIG. 25E, the opening 25 is then hollowed in the thermoplastic film 18*c* by a die or the like, at its position at which the space should be formed. As shown in FIG. 25F, the release films 18*d* are then released therefrom. Releasing the release films 18*d* enables the electrical conducting paste in the electrical continuity portion 20 to be projected from surfaces of the adhesive layers. This causes filling efficiency of filler into the through-holes 13*h* to be enhanced when the printed circuit boards 12*a* and 12*b* are connected to each other, which is useful to a stable alloy connection. It was affirmed as an optimum from results of experimentations in order to relate to a projected amount of the electrical conducting paste that each of the release films 18*d* has the thickness from 25 μm to 50 μm.

The following will describe how to connect the printed circuit boards 12*a*, 12*b*, and the connection layer 13*a* to each other. FIGS. 26A through 26E and 27 illustrate how to connect the printed circuit boards 12*a*, 12*b*, and the connection layer 13*a* to each other. Each of these figures shows their cross-section.

The printed circuit boards 12*a*, 12*b*, and the connection layer 13*a* are connected according to the operations as follows: cushion member 35*b* (see FIG. 26E), the printed circuit board 12*b* (see FIG. 26D), the connection layer 13*a* (see FIG. 26C), the printed circuit board 12*a* (see FIG. 26B), and cushion member 35*a* (see FIG. 26A) are stacked in this order; and after these items have been stacked, the cushion members 35*a*, 35*b* subject the printed circuit board 12*b*, the connection layer 13*a*, the printed circuit board 12*a* thus stacked to predetermined pressure as indicated by arrows shown in FIG. 27 under a temperature of a melting point of the low-melting metal particle in the electrical conducting paste or more.

This allows the insulation portion 18 of the connection layer 13*a* to be connected to the printed circuit boards 12*a*, 12*b* through the adhesive of the adhesive layer 18*b* as well as the electric conduction portions 20 of the connection layer 13*a* to be connected to the electrode terminals 17 of the printed circuit boards 12*a*, 12*b*.

The following will describe such a mechanism that the electric conduction portions 20 of the connection layer 13*a* are connected to the electrode terminals 17 of the printed circuit boards 12*a*, 12*b*. The electrical conducting paste of the electric conduction portions 20 and the electrode terminals 17 are generally connected according to the so-called metallizing technology. As described above, the electrical conducting paste contains the low-melting metal particle, the high-melting metal particle, and the binder resin.

Such the binder resin prevents the low-melting metal particle and the high-melting metal particle from being metalized because these metal particles are not directly come in contact with each other when no pressure is applied even if a temperature thereof is a melting point of the low-melting metal particle or more. When predetermined pressure is applied under a temperature of a melting point of the low-melting metal particle or more (at a temperature where the base members are fused and bonded), the binder resin is viscously fluidized and pushed out of a space between the metal particles so that the low-melting metal particle and the high-melting metal particle are directly come in contact with each other. In this moment, the fluidized low-melting metal particle is come in contact with the metal in the electrode terminal so that they can be metalized, thereby enabling the electric conduction portions 20 and the electrode terminals 17 to be connected to each other at the same time when the metallization occurs in the electric conduction portions 20. This allows metallization to be realized at a short time.

Even if the metal particles are pulverized one, the binder resin acts as a lubricant between the metal particles so that the electrical conducting paste alters to its plastic state such as a lump of clay. This allows even pressure to be subject to a whole of each of the through-holes 13*h*. The low-melting metal particle and the high-melting metal particle in each of the through-holes 13*h* may be equally connected so that even metallization occurs in each of the through-holes 13*h*. It is thus possible to implement the stable metallizing connection. In order to implement such the metallizing connection easily, it is preferable that the binder resin is thermoplastic resin.

As the thermoplastic resin used as the core member 18*a* and the adhesives 18*b* on and under the thermoplastic resin, those having high fluidity are not suitable therefor in order to implement the stable metallizing connection easily. For example, if epoxy resin having high fluidity is used as the adhesive layers with them being placed under B-stage (semi-softening state), the epoxy resin becomes liquid by applying heat thereto when connecting the connection layer to the printed circuit boards. If further applying pressure thereto, the liquefied epoxy resin is enter into the electrical conducting paste and substituted, thereby hindering the metal particles from being come contact with each other in the electrical conducting paste. This disenables the sufficient metallizing from being implemented, so that resistance of a connection portion between the electric conduction portions 20 and the electrode terminal can be increased. If it is true, it is necessary for the adhesive layer to be stiffened within a range where it does not lose its bonding strength, thereby reducing its fluidity.

If the thermoplastic resin has its fluidity so that it can be fluidized when applying heat thereto, the sufficient metallizing is also disenabled from being implemented. If a modulus of elasticity of the thermoplastic resin is not properly low, this does not subject even pressure to the electrical conducting paste, thereby disenabling the sufficient metallizing from being implemented.

As described above, as the core member 18*a*, high heat-resistant thermoplastic resin to which aminosilane series coupling agent is applied is suitably used. In order to maintain adhesive strength to the upper and lower printed circuit boards 12*a*, 12*b* that is placed under C-stage (stiffened), any material having amino framework is suitably used as the core member. It is also effective that very thin thermosetting adhesive is applied to an outermost layer of the adhesive layer. In a case of thin film of some μm, it is possible to maintain suitable connection stability without preventing the metallizing of electrical conducting paste.

Figure 28A:
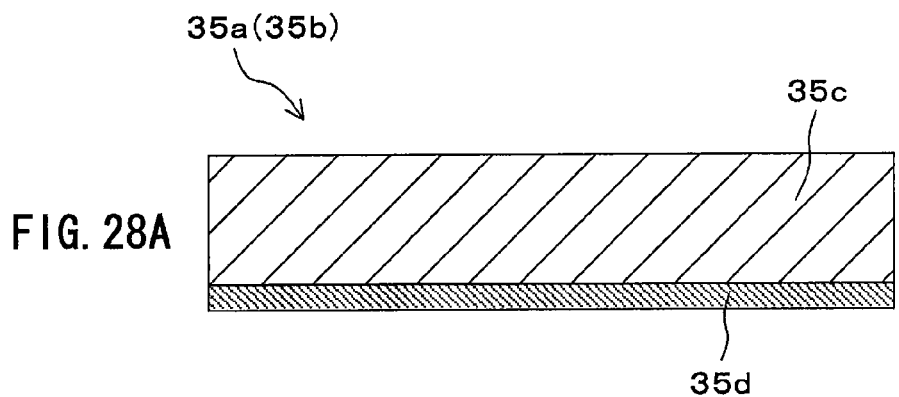
FIGS. 28A and 28B are diagrams each for illustrating a cushion member.
Figure 28B:
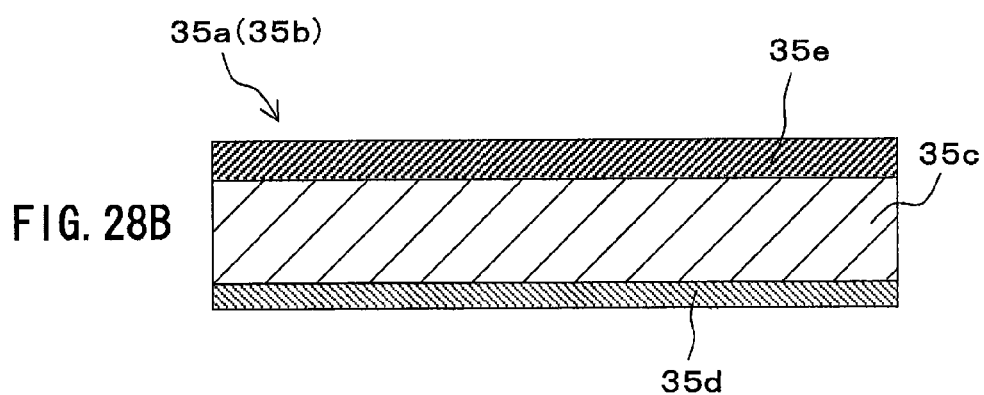

The following will describe a configuration of each of the cushion members 35a, 35b. FIGS. 28A and 28B show a detailed configuration of each of the cushion members 35a, 35b. FIG. 28A shows a first example of each of the cushion members 35a, 35b. FIG. 28B shows a second example of each of the cushion members 35a, 35b. When connecting the printed circuit boards 12a and 12b to each other mechanically and electrically through the connection layer 13a, surfaces of the printed circuit boards 12a and 12b facing the space 19a formed in the connection layer 13a may be bent. If any bending occurs in the surfaces of the printed circuit boards 12a and 12b, surface mounting of components may be hindered by the bending. In order to prevent such the bending, a configuration of each of the cushion members 35a, 35b is figured out in this embodiment.

When connecting the printed circuit boards 12a and 12b to each other mechanically and electrically through the connection layer 13a, it is desirable to apply pressure thereto by means of a member having high elasticity (low modulus-of-elasticity member). In the printed circuit board assembly 1 according to the embodiment, however, in which the connection layer 13a has the space 19a, the bending may occur in the surfaces of the printed circuit boards 12a and 12b when applying heat and/or pressure thereto, so that a part of each of the surfaces enters into the space 19a. In order to prevent such the bending of each of the printed circuit boards 12a, 12b, the member having low elasticity (high modulus-of-elasticity member) may be used. If, however, the member having low elasticity (high modulus-of-elasticity member) is used to apply the pressure thereto, it is difficult to smooth out irregularities in the surfaces of the printed circuit boards 12a and 12b. This prevents even pressure from being applied over a whole surface of each of the printed circuit boards 12a, 12b, thereby failing to implement any sure connection. Thus, as the first example of each of the cushion members 35a, 35b, a cushion member having two layers, a base layer 35c made of high modulus-of-elasticity material and an irregularity-smoothing layer 35d made of low modulus-of-elasticity material is used as shown in FIG. 28A. By using such the cushion members 35a, 35b as the first example thereof, it is possible to prevent the bending of surface of each of the printed circuit boards 12a, 12b so that a part of the surface of each of the surfaces enters into the space 19a when applying pressure thereto and apply even pressure over a whole surface of each of the printed circuit boards 12a, 12b.

Alternatively, expansion and/or shrinkage of the cushion members 35a, 35b occurred at their heating and/or cooling causes the printed circuit boards 12a, 12b to elongate, so that any bending may occur in the printed circuit boards 12a and 12b. Thus, as the second example of each of the cushion members 35a, 35b, a cushion member having three layers, a base layer 35c that is made of high modulus-of-elasticity material, an irregularity-smoothing layer 35d that is made of low modulus-of-elasticity material, and a thermal-shrinkage-preventing layer 35e that prevents the base layer from being shrunk is used as shown in FIG. 28B. By using such the cushion members 35a, 35b as the second example thereof, it is possible to prevent the bending of surface of each of the printed circuit boards 12a, 12b so that a part of the surface of each of the surfaces enters into the space 19a when applying pressure thereto, apply even pressure over a whole surface of each of the printed circuit boards 12a, 12b, and prevent the cushion member 35a, 35b from being expanded and/or shrunk at their heating and/or cooling.

Relative to the cushion member 35a, 35b of the first and second examples, as a result of experiment, it was confirmed that the suitable irregularity-smoothing layer 35d had a thickness from 5 μm to 20 μm and was made of a silicone compound or a fluorine compound that had a modulus of elasticity of 100 MPa or less when applying heat and/or pressure thereto and had a high heat-resisting property and a release property. It was also confirmed that the suitable base layer 35c had a thickness from 50 μm to 300 μm and was made of a material that had a modulus of elasticity of at least 1 GPa or more when applying heat and/or pressure thereto. It was further confirmed that as the suitable thermal-shrinkage-preventing layer 35e, an electrolytic copper foil having a coefficient of thermal expansion of 20 ppm or less and a center line average coarse Ra of 1.5 or more was used.

Figure 27:
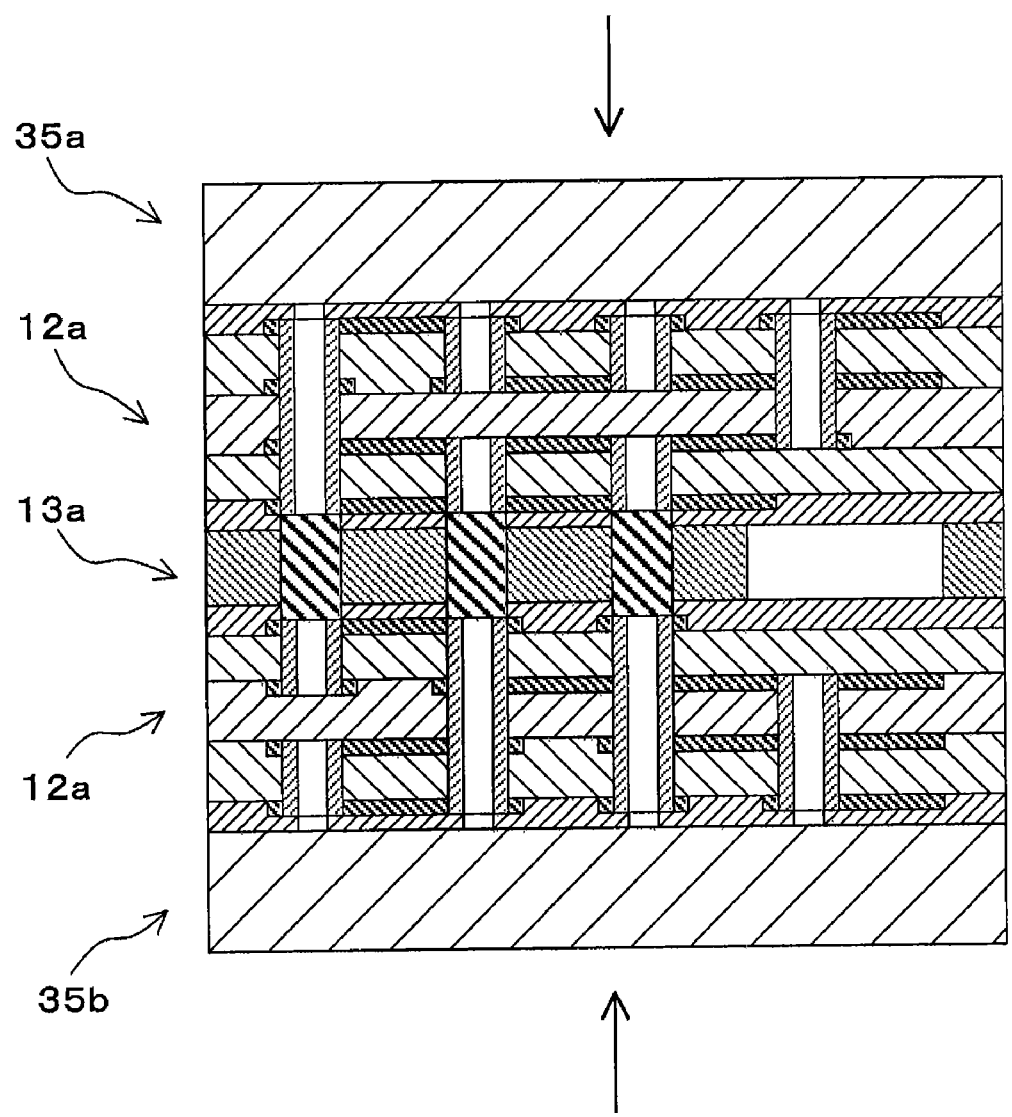
FIG. 27 is a diagram for showing how to manufacture the printed circuit board assembly.
Figure 29:
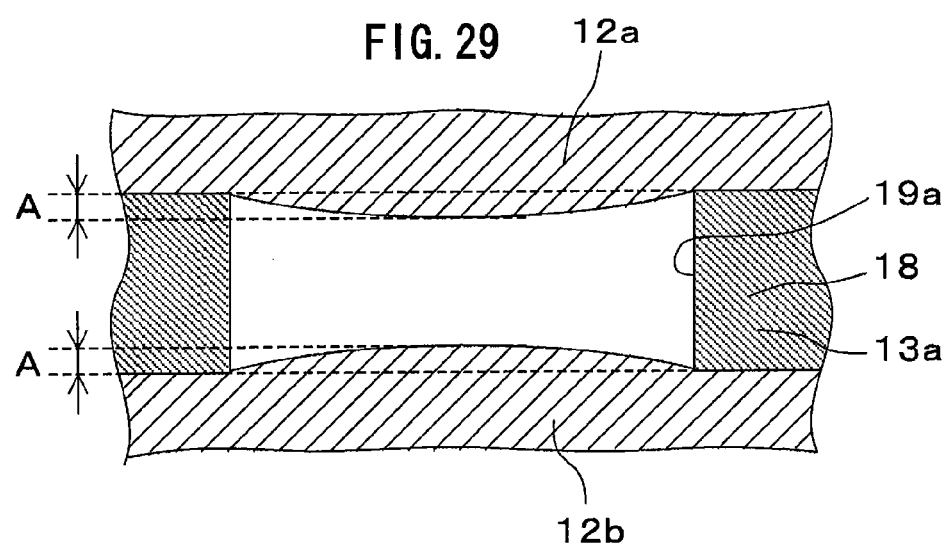
FIG. 29 is a diagram for showing space.

The printed circuit boards 12a, 12b and the connection layer 13a were connected to each other by using the above cushion members 35a, 35b at pressure of 4 MPa under a temperature of 250 degree Celsius according to the method described by using FIGS. 26 and 27. As a result thereof, it was confirmed that the bending, which was indicated by characters "A", "A" shown in FIG. 29, occurred at the surface of each of the printed circuit boards 12a and 12b into the space 19a stayed within a range of 30 μm or less.

The printed circuit boards 12a, 12b and the connection layer 13a were connected to each other at pressure of 2 MPa under a temperature of 250 degree Celsius according to the method described by using FIGS. 26 and 27. As a result thereof, it was confirmed that the bending occurred at each of the surfaces of the printed circuit boards 12a and 12b stayed within a range that was negligible on the surface mounting. Therefore, it is conceivable that the effective connection of the printed circuit boards 12a, 12b and the connection layer 13a as shown in FIGS. 26 and 27 is obtained under the following temperature and pressure: the pressure stays within a range from 2 to 8 MPa under the temperature of 230 degrees Celsius or less; or the pressure stays within a range from 2 to 4 MPa under the temperature of a range from more than 230 degrees Celsius to 250 degrees or less.

The cushion members 35a, 35b are one example of elastic members. The base layer 35c is one example of the high modulus-of-elasticity member, and the irregularity-smoothing layer 35d is one example of the low modulus-of-elasticity member. The thermal-shrinkage-preventing layer 35e is one example of the thermal-shrinkage-preventing members.

Although two printed circuit boards 12a, 12b and the connection layer 13a have been connected to each other mechanically and electrically in the above embodiment shown in FIGS. 26 and 27, this application is not limited thereto. According to the embodiment, the printed circuit board assembly is manufactured so that the printed circuit boards of three or more may be stacked and connected to each other through the connection layers.

The following will describe a method of manufacturing the printed circuit board assembly 2 as the second embodiment shown in FIG. 4. The printed circuit board assembly 2 is different from the printed circuit board assembly 1 in only form of the space 19a in the connection layer 13a, as described above. When manufacturing the printed circuit board assembly 2, at step shown in FIG. 25E, the opening 25 is hollowed up to a predetermined level in the thermoplastic film 18c, not piercing therethrough. Remaining steps of this method of manufacturing the printed circuit board assembly 2 are similar to those of the method of manufacturing the printed circuit board assembly 1.

Figure 30A:
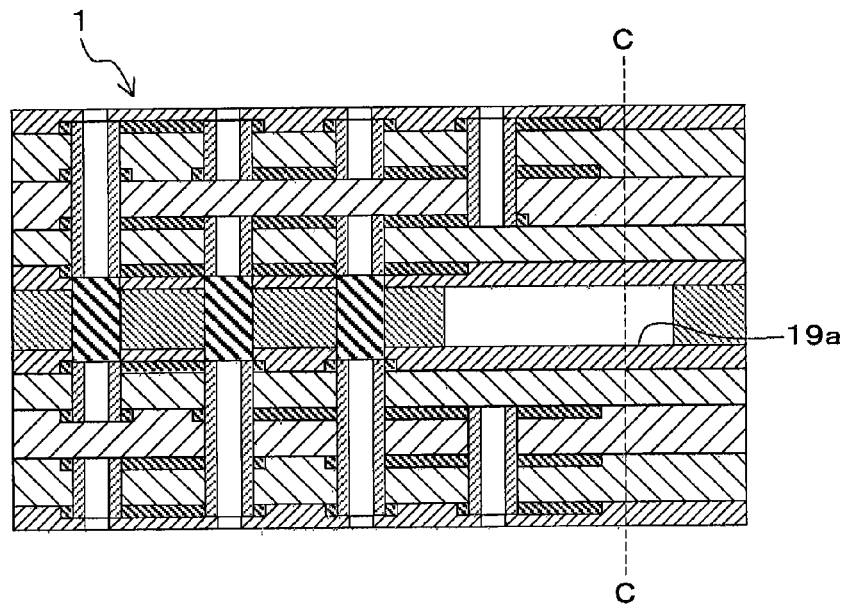
FIGS. 30A and 30B are diagrams each for showing how to manufacture the printed circuit board assembly according to the third embodiment.
Figure 30B:
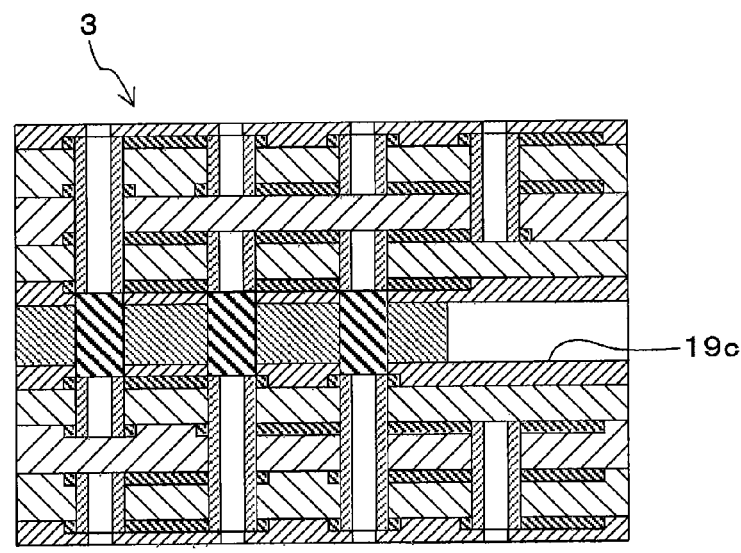

The following will describe a method of manufacturing the printed circuit board assembly 3 as the third embodiment shown in FIGS. 5 and 6. The printed circuit board assembly 3 is different from the printed circuit board assembly 1 only in that the connection layer 13c has the space 19c that is formed by opening a side end part of the connection layer 13c and is communicated to outside of the printed circuit board assembly 3. Therefore, after the printed circuit board assembly 1 has been manufactured according to the above method as shown in FIG. 30A, the printed circuit board assembly 1 thus manufactured is cut along the lines C-C, so that the printed circuit board assembly 3 can be manufactured. This allows the bending of a surface of each of the printed circuit boards 12a, 12b into the space 19c to be reduced as compared by a case where the printed circuit boards 12a, 12b are connected to each other through the connection layer 13c as shown in FIGS. 26 and 27 after the connection layer 13c having the space 19c at its side end portion has been formed as shown in FIG. 6.

The following will describe a method of manufacturing the printed circuit board assemblies 4A, 4B as the fourth embodiment of the invention shown in FIGS. 7 and 8. Each of the printed circuit board assemblies 4A, 4B is different from the printed circuit board assembly 1 only in that electronic components such as the LSI 21 are mounted on the printed circuit board 12b so that the electronic components can be positioned inside the space 19a. Therefore, after the electronic components such as the LSI 21 have been previously mounted on predetermined positions of the printed circuit board 12b, the printed circuit boards 12a, 12b are connected to each other through the connection layer 13c according to the method described by using FIGS. 26 and 27, so that the printed circuit board assemblies 4A, 4B can be manufactured.

Relative to the printed circuit board assembly 5 shown in FIG. 9, the printed circuit board assembly 6 shown in FIG. 11, the printed circuit board assembly 7 shown in FIG. 12 and the like, the printed circuit board assembly 9 shown in FIG. 16 and the like, and the printed circuit board assembly 10 shown in FIG. 21 and the like, similar to the above method of manufacturing the printed circuit board assemblies 4A, 4B, after the electronic components or the like have been previously mounted on predetermined positions of the printed circuit board 12b, the printed circuit boards 12a (12c, 12d, or 12f), 12b are connected to each other through the connection layer 13d (13c or 13a) according to the method described by using FIGS. 26 and 27, so that the printed circuit board assembly 5, 6, 7, 9, or 10 can be manufactured. The electronic components to be positioned on the upper surface of the printed circuit board assembly or under the bottom surface thereof are mounted thereon or attached thereto after the printed circuit boards 12a (12c, 12d, or 12f), 12b have been connected to each other through the connection layer 13d (13c or 13a).

The air inlet 23 of the printed circuit board assembly 5 and the opening 25 of the printed circuit board assembly 6 have been previously processed by drill or the like before the printed circuit boards 12c (12d), 12b are connected to each other through the connection layer 13d according to the method described by using FIGS. 26 and 27.

The following will describe a method of manufacturing the printed circuit board assembly 9 shown in FIG. 15. The connection layer 13g is made by means of the same method as that of the connection layer 13a of the printed circuit board assembly 1. A mask is then formed on the connection layer 13g by using any photolithographic technologies and a pattern is made by using sandblasting to produce a channel having a desired form. Any liquidized resin is filled into the channel to make the optical waveguide 29 of this resin and after the resin has been set by applying heat thereto, the surface of the connection layer 13g is polished. The printed circuit boards 12e, 12b are then connected to each other through the connection layer 13g according to the method described by using FIGS. 26 and 27.

According to the embodiments of the printed circuit board assemblies, the printed circuit boards made by using the known technology such as the build-up technology are mechanically and electrically connected to each other through the connection layer according to the method described by using FIGS. 26 and 27 to manufacture each of the printed circuit board assemblies. This enables the multi-layer circuit board assembly to be manufactured at low costs as compared with a case where the final circuit board assembly is manufactured by using the build-up technology or the like.

According to the embodiments of the methods of manufacturing the printed circuit board assemblies, the printed circuit boards made by using the known technology such as the build-up technology are mechanically and electrically connected to each other through the connection layer according to the method described by using FIGS. 26 and 27 to manufacture each of the printed circuit board assemblies. This enables the multi-layer circuit board assembly to be manufactured at low costs as compared with a method wherein the final circuit board assembly is manufactured by using the build-up technology or the like.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A printed circuit board assembly comprising:
 a plurality of printed circuit boards including a first printed circuit board including a first plurality of layers and a second printed circuit board including a second plurality of layers, the first printed circuit board mechanically and electrically connected to the second printed circuit board in a stacked arrangement; and
 a connection layer connecting the first and second printed circuit boards adjacent to each other, wherein the connection layer includes an insulation portion and an electric conduction portion, the insulation portion including an insulating member adhered between the adjacent first and second printed circuit boards, and the electric conduction portion passing through the insulation portion and connecting a first electrode terminal of the first printed circuit board to an adjacent second electrode terminal of the second printed circuit board, wherein the connection layer includes a space formed by opening a part of a surface of the connection layer, said surface connecting to at least one of the printed circuit boards, and wherein an electronic component is mounted on one of the printed circuit boards to be arranged in the space, the electronic component being connected to wiring of said one of the printed circuit boards,
 wherein the insulation portion includes an insulating plastic material that connects the adjacent first and second printed circuit boards to each other;
 wherein the electric conduction portion includes an electrical conducting paste including a low-melting metal particle and a high-melting metal particle, and the electric conduction portion is connected to the first electrode terminal and the second electrode terminal of the adjacent first and second printed circuit boards by using metallizing technology which connects metals to each other by applying a predetermined pressure thereto at a predetermined temperature;

wherein the insulation portion includes a thermoplastic resin as the insulating plastic material;

wherein the electrical conducting paste includes tin as a low-melting metal particle and at least one of copper and silver as a high-melting metal particle;

wherein a curable epoxy resin is applied to a first surface of the first printed circuit board and a second surface of the second printed circuit board, the first and second surfaces adhering to an adhesive layer of the connection layer; and wherein the thermoplastic resin has a chemical affinity for the curable epoxy resin.

2. The printed circuit board assembly according to claim 1 further comprising:

a third printed circuit board mechanically and electrically connected to the second printed circuit board in a stacked arrangement; and a second connection layer connecting the second and third printed circuit boards adjacent to each other, wherein the second connection layer includes a second insulation portion and a second electric conduction portion, the second insulation portion including a second insulating member adhered between the adjacent second and third printed circuit boards, and the second electric conduction portion passing through the second insulation portion and connecting a third electrode terminal of the second printed circuit board to an adjacent fourth electrode terminal of the third printed circuit board.

3. The printed circuit board assembly according to claim 1 wherein the space extends through the connection layer such that both of the surfaces of the adjacent first and second printed circuit boards are adjacent to the space.

4. A printed circuit board assembly comprising:

a plurality of printed circuit boards including a first printed circuit board including a first plurality of layers and a second printed circuit board including a second plurality of layers, the first printed circuit board mechanically and electrically connected to the second printed circuit board in a stacked arrangement; and a connection layer connecting the first and second printed circuit boards adjacent to each other, wherein the connection layer includes an insulation portion and an electric conduction portion, the insulation portion including an insulating member adhered between the adjacent first and second printed circuit boards, and the electric conduction portion passing through the insulation portion and connecting a first electrode terminal of the first printed circuit board to an adjacent second electrode terminal of the second printed circuit board, wherein the connection layer includes a space formed by opening a part of a surface of the connection layer, said surface connecting to at least one of the printed circuit boards, and wherein an electronic component is mounted on one of the printed circuit boards to be arranged in the space, the electronic component being connected to wiring of said one of the printed circuit boards, wherein the insulation portion includes an insulating plastic material that connects the adjacent first and second printed circuit boards to each other;

wherein the electric conduction portion includes an electrical conducting paste including a low-melting metal particle and a high-melting metal particle, and the electric conduction portion is connected to the first electrode terminal and the second electrode terminal of the adjacent first and second printed circuit boards by using metallizing technology which connects metals to each other by applying a predetermined pressure thereto at a predetermined temperature;

wherein the insulation portion includes a thermoplastic resin as the insulating plastic material;

wherein the electrical conducting paste includes tin as a low-melting metal particle and at least one of copper and silver as a high-melting metal particle;

wherein a curable epoxy resin is applied to a first surface of the first printed circuit board and a second surface of the second printed circuit board, the first and second surfaces adhering to an adhesive layer of the connection layer;

wherein the thermoplastic resin is adhered to the first and second surfaces by an adhesive having a chemical affinity for the curable epoxy resin and the thermoplastic resin; and wherein the thermoplastic resin and the adhesive have a cumulative thickness of at least 50 μm and the adhesive has a thickness of 10 μm or less.

* * * * *